(12) United States Patent
Verma et al.

(10) Patent No.: US 12,374,570 B2
(45) Date of Patent: Jul. 29, 2025

(54) MACHINE LEARNING-BASED SCATTEROMETRY AND FEED FORWARD TECHNIQUES FOR GATE-ALL-AROUND TRANSISTORS

(71) Applicant: Intel Corporation, Santa Clara, CA (US)

(72) Inventors: Deepak Verma, Hillsboro, OR (US); Navnit Agarwal, Portland, OR (US); Ayan Das, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 17/901,676

(22) Filed: Sep. 1, 2022

(65) Prior Publication Data

US 2024/0079254 A1 Mar. 7, 2024

(51) Int. Cl.
*H01L 21/67* (2006.01)
*G06F 18/214* (2023.01)
*G06N 20/00* (2019.01)

(52) U.S. Cl.
CPC ...... *H01L 21/67253* (2013.01); *G06F 18/214* (2023.01); *G06N 20/00* (2019.01)

(58) Field of Classification Search
None
See application file for complete search history.

(56) References Cited

U.S. PATENT DOCUMENTS

| 9,859,368 B2 * | 1/2018 | Kim | H10D 62/151 |
|---|---|---|---|
| 2021/0398972 A1 * | 12/2021 | Yang | H10D 84/0109 |
| 2023/0142936 A1 * | 5/2023 | Sendoda | G06N 20/20 |
| | | | 382/100 |

OTHER PUBLICATIONS

Yi, Jingang, Ye Sheng, and C. Shan Xu. "Neural network based uniformity profile control of linear chemical-mechanical planarization." IEEE transactions on semiconductor manufacturing 16.4 (2003): 609-620. (Year: 2003).*

Lu, Hui, Liang Gong, and Minghai Xu. "Thermal performance of microchannels with dimples for electronics cooling." International Conference on Micro/Nanoscale Heat Transfer. vol. 36154. American Society of Mechanical Engineers, 2013. (Year: 2013).*

(Continued)

*Primary Examiner* — Carlos R Ortiz Rodriguez
(74) *Attorney, Agent, or Firm* — Eversheds Sutherland (US) LLP

(57) ABSTRACT

This disclosure describes systems, methods, and devices for estimating dimple etch recess depth in a gate-all-around transistor. A method may include receiving, by a device, first measurements of the gate-all-around transistor, the first measurements based on first optical data from a spacer etch stage of fabricating the gate-all-around transistor; inputting, by the at least one processor, using a feed forward network, the first measurements to a machine learning model trained to estimate dimple etch recess in the gate-all-around transistor; inputting, by the at least one processor, to the machine learning model, second optical data from a dimple etch stage of fabricating the gate-all-around transistor; and generating, by the at least one processor, using the machine learning model, based on the second optical data and the first measurements, second measurements comprising the first measurements and dimple etch recess estimates for the gate-all-around transistor.

20 Claims, 19 Drawing Sheets

(56) References Cited

OTHER PUBLICATIONS

Christensen, Björn. "Fabrication and characterization of gate last Si MOSFETs with SiGe source and drain." (2017). (Year: 2017).*

Marini, Enri. "Investigation of ALD dielectrics in silicon capacitors." 35th Annual Microelectronic Engineering Conference at RIT. 2017. (Year: 2017).*

Orji, Ndubuisi G., et al. "Metrology for the next generation of semiconductor devices." Nature electronics 1.10 (2018): 532-547. (Year: 2018).*

Allegro, Paula RP, et al. "Unsupervised machine learning application to identify single-event transients (SETs) from noise events in MOSFET transistor ionizing radiation effects." Microelectronics Reliability 142 (2023), Received Jun. 28, 2022: 114916 (Year: 2023).*

\* cited by examiner

MACHINE LEARNING-BASED SCATTEROMETRY AND FEED FORWARD TECHNIQUES FOR GATE-ALL-AROUND TRANSISTORS

TECHNICAL FIELD

This disclosure generally relates to systems and methods for transistor scatterometry and, more particularly, to machine learning-based scatterometry with feed forward techniques for transistors.

BACKGROUND

Scatterometry/Optical Critical Dimension (OCD) ellipsometry is an indirect, non-destructive, non-imaging measurement technique that may be used to measure transistor dimensions. However, some transistors use designs for which accurately measuring certain dimensions can be difficult.

DETAILED DESCRIPTION

Figure 1:
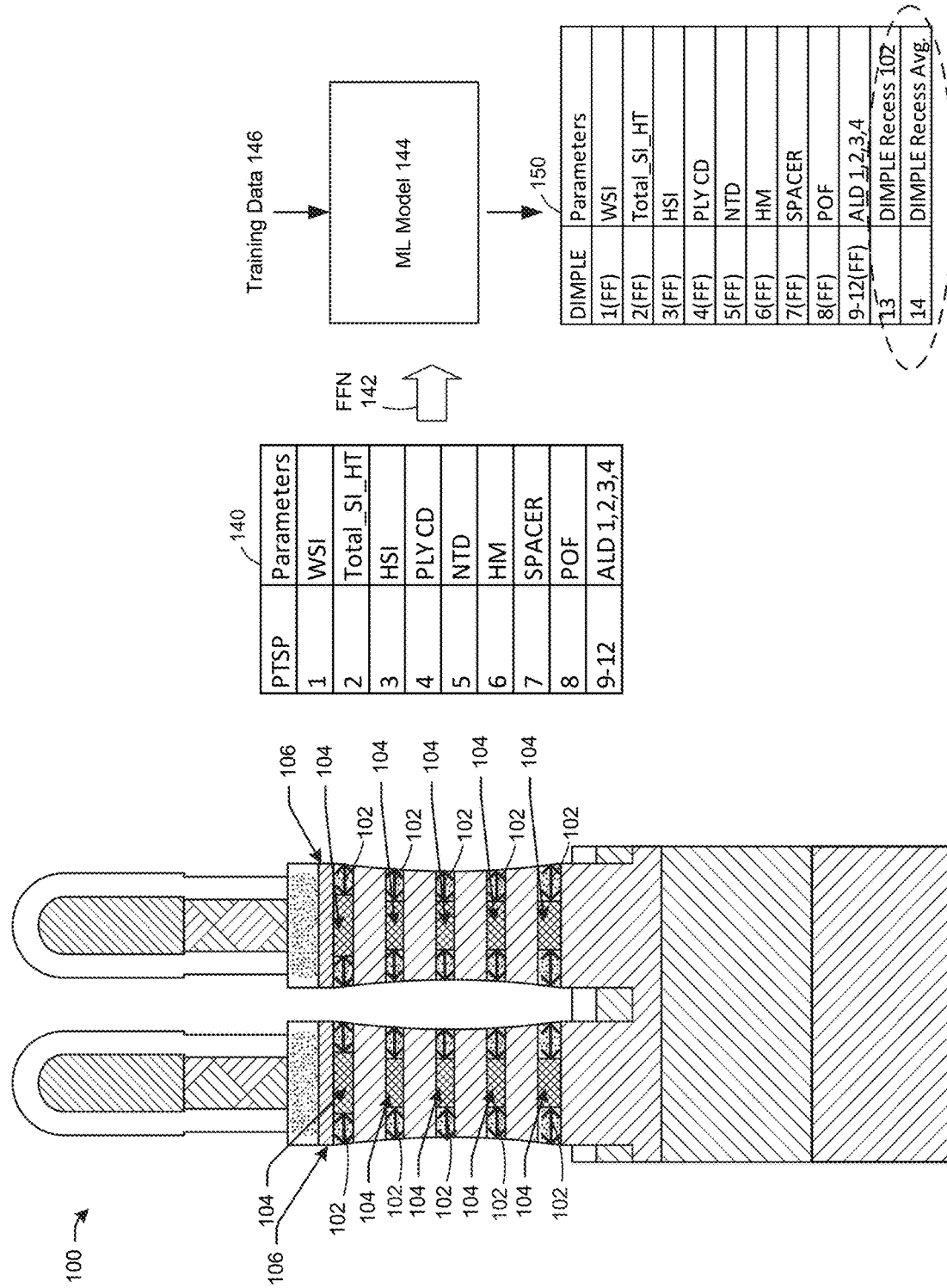
FIG. 1 illustrates an example cross-section view of a gate-all-around transistor measured using a feed forward technique, in accordance with one or more example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

Scatterometry/Optical Critical Dimension (OCD) ellipsometry is an indirect, non-destructive, non-imaging measurement technique. Scatterometry is based on measuring the spectra reflection from a dense repeating structure and provides structural data from averaging hundreds of lines using a model-based regression. While scatterometry is powerful and a well-established technique on Fin field-effect transistor (FET) technology, the standalone approach is not as effective on some process nodes that utilize RibbonFET and gate all around (GAA) transistor architecture. The limitation stems primarily from the undistinguishable spectral signals and model complexity leading to low sensitivity in the desired parameter. In particular, whereas FinFET architecture may use a single channel partially surrounded by a gate, RibbonFET and GAA transistor architecture may include multiple channels completely surrounded by the gate, resulting in multiple DIMPLE recesses in between the respective channels.

Scatterometry/OCD ellipsometry may use light sensing devices (e.g., photo detectors, photodiodes) for detecting light reflected and/or refracted by layers and features of a transistor during fabrication phases. The light reflected and/ or refracted by the layers and features may be indicative of parameters that may be used to evaluate and adapt the fabrication process. Scatterometry/OCD ellipsometry may be used to extract information about a transistor surface upon which incident light has been directed. The extracted information may include dishing, erosion, profile, thickness of thin films and critical dimensions of features present on and/or in the surface, along with other information. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light may change based on properties of the transistor surface upon which the light is directed. The properties include chemical properties of the surface, planarity of the surface, features on the surface, voids in the surface, the number and/or type of layers beneath the surface, and the like. The different combinations of the transistor properties may correspond to different phase and/or intensity values of the incident light, resulting in unique intensity/phase signatures of the complex light that is reflected/refracted. By comparing a signal signature to a library of signal signatures, a ML model may estimate the properties of a transistor surface. In one example, a complex indication of refraction may be represented by $N=n-jk$, where j is an imaginary number.

DIMPLE Etch is one such step in the RibbonFET flow which produces complex spectral signals and has low parameter sensitivity with similar or close-to-matching material dispersion properties. Successful measurement of individual SiGE DIMPLE is critical in mitigating short-channel effects and will help target performances. At this step, the sacrificial SiGe is etched out at different rates between the individual nanowires, and the prediction of individual SiGe recess was found to be difficult even after a machine learning (ML) training. While ML-based scatterometry or ML models (e.g., an ALLEGRO model) may function well on a steady state process, it was observed to have failed on even the slightest of upstream process changes. DIMPLE recesses are critical nanowire measurements that may control transistor performance (e.g., current, turn-on voltages, leakages, etc.).

Therefore, traditional model based scatterometry measurements fail on RibbonFET technology with GAA architecture because of model complexity and low signal sensitivity from upstream process changes. DIMPLE Etch is one such example, where individual RECESS measurements have failed despite ML training. Currently, DIMPLE Etch is a parameter that can be measured by using inline AFM (atomic force microscope) or by cross-sectional TEM (transmission electron microscope). The traditional model based scatterometry solution is currently only able to provide an average value of the DIMPLE Etch parameter and thus is insufficient for RibbonFET and GAA transistors. The ALLEGRO ML approach, which requires TEM trained data points, does seem to provide consistent RECESS values, so long as the process remains in its steady state.

A successful non-destructive method of individual recess measurement at DIMPLE has not been possible so far. TEM is the only known method, but may be capable of measuring very few sites. Moreover, the throughput time of the TEM tool is very low.

There is therefore a need for a machine learning-based scatterometry and feed forward techniques to measure RibbonFET and other GAA transistors.

In one or more embodiments, the present disclosure demonstrates a feed forward (FFWD) based machine learning (e.g., ALLEGRO-based ML) solution to DIMPLE Etch measurement problem for RibbonFET and other GAA transistors. The present disclosure shows that any upstream changes to the POR (power-on reset) process does not impact the FFWD solution and the critical parameter of interest, can still be accurately captured. With an ALLEGRO based feed forward method, the enhanced techniques herein are able to accurately predict individual recess numbers. The scatterometry enables fast, high-volume, early inline detectability for this critical parameter along with possibility of similar individual parameter measurements at other layers in the future. TEM may be used as a reference to train ML, but there may not be a strong match between ALLEGRO and TEM data. A FFWD approach may provide a better match to the TEM data. In addition, ML training is finite, so adding the FFWD to the ML model trained with TEM data may provide a more accurate solution for estimating the DIMPLE Etch measurements of each transistor recess.

In machine learning, a FFWD approach (e.g., using a feed forward neural network—FNN) is a neural network in which the connections between nodes do not form a cycle (e.g., in contrast with a recurrent neural network). FNNs processing information in one direction, so the information does not move backwards.

In one or more embodiments, by feeding forward (e.g., using a FNN) parameters, which may have similar optical profiles as the Si and SiGe measured for DIMPLE recess depth, from the SPACER ETCH layer to the DIMPLE layer, the enhanced techniques herein are able to de-correlate the recess signal from other interfering signals used in the transistor measurements (e.g., interfering complex signals caused by the reflections/refractions of incident light into small spaces such as DIMPLE recesses of a GAA transistor). Scatterometry models at SPACER ETCH and DIMPLE may be built. The DIMPLE ML model may be trained with TEM reference data to capture the recess behavior between individual nanowires. The designed ML training set may include a set of TEM data points obtained on the POR as well as non-POR process of the flow. While the non-critical parameters such as spacer thickness, poly, etc. are fed forward from SPACER ETCH, only the RECESS parameter may be extracted at DIMPLE through test runs. The enhanced techniques may further validate ALLEGRO measurements with the reference data, which not only enables individual measurement of the critical parameter at DIMPLE layer, but also opens an opportunity to carry out individual measurements of various other parameters at other layers like the Nano wire release, where the change in parameter causes a detectable change in spectra. This was not possible in semiconductor manufacturing until now.

In one or more embodiments, instead of providing an average number for the DIMPLE Etch parameter (e.g., an average recess for multiple dimple etches in a RibbonFET or other GAA transistor), the enhanced techniques can provide individual recess measurement data. These measurements can be used to measure more points on the wafer in the same amount of time along with parameters that are measured by traditional scatterometry based approach. This in turn can be used to improve/develop new processes and improve within wafer uniformity and wafer-wafer uniformity. Successful measurement of individual SiGE DIMPLE will eventually help mitigating short-channel effects and target performances for some nodes.

In one or more embodiments, the training data set for the ML may include Germanium concentration skews (e.g., varying dimple recess depths), etch chemistry skews, and the like. After measuring the SPACER ETCH layer, parameters may be fed forward to the DIMPLE etch process to avoid re-measuring the parameters. The DIMPLE etch ML model may be trained to estimate the individual DIMPLE recesses based on the fed forward parameters, resulting in single nanowire estimates of the DIMPLE recesses.

One existing technique for training the ML model is to skew DIMPLE recesses values by making them shorter and wider, and training the ML model on those skews. However, because the DIMPLE recess parameter correlates to many other parameters of a transistor, such training may be insufficient. Therefore, in one or more embodiments, the training data may include Ge concentration skews. For example, Table 1 below shows Ge concentration skews ZZ1 and ZZ2 for training the ML model:

TABLE 1

Ge Concentration Skews for Training the ML Model:

| ZZ1<br>Ge %: | ZZ2<br>Ge %: |
|---|---|
| 27.5 | 19 |
| 30.8 | 27.5 |
| 23.6 | 15.2 |
| 15.2 | 23.6 |
| 19 | 30.8 |

In one or more embodiments, the Ge concentration skews of Table 1 for training data of the ML may break the correlation between the different DIMPLE recess values. The Ge skews of Table 1 may represent DIMPLE etch recess depths (e.g., in nanometers).

In one or more embodiments, the ML training data may include varying etch chemistries.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 illustrates an example cross-section view of a gate-all-around transistor 100 measured using a feed forward technique, in accordance with one or more example embodiments of the present disclosure.

Figure 4:
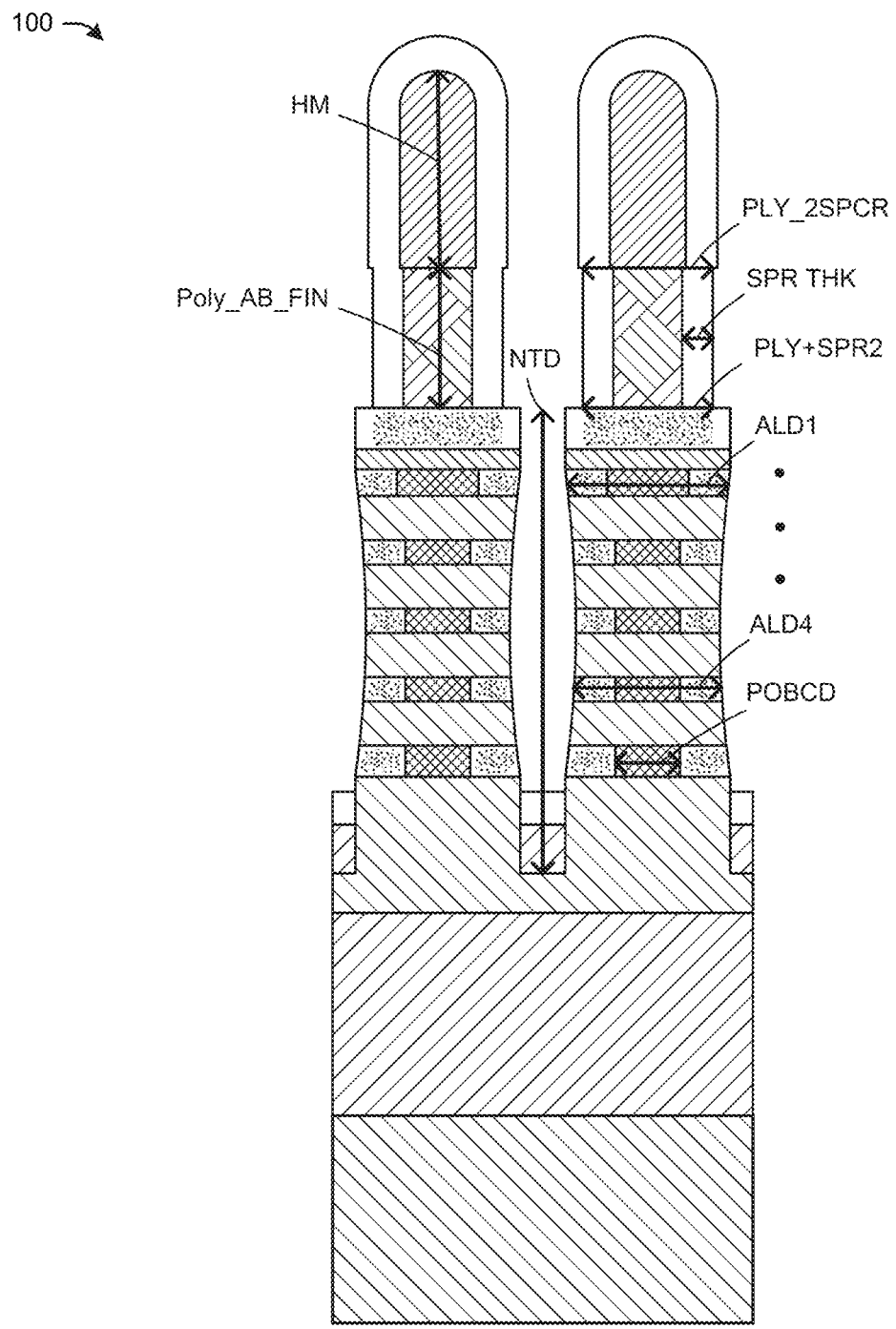
FIG. 4 illustrates the example cross-section view of the gate-all-around transistor of FIG. 1 with additional measurement parameters shown, in accordance with one or more example embodiments of the present disclosure.
Figure 5:
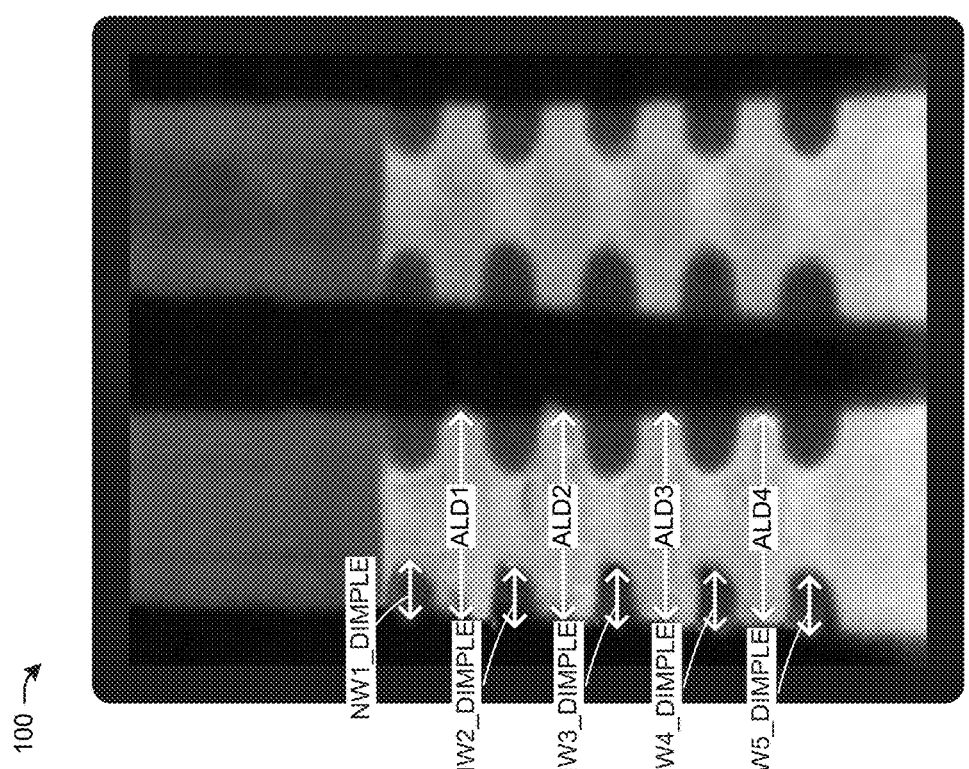
FIG. 5 illustrates an example image of the gate-all-around transistor of FIG. 1 with dimple and other measurement parameters shown, in accordance with one or more example embodiments of the present disclosure.
Figure 6:
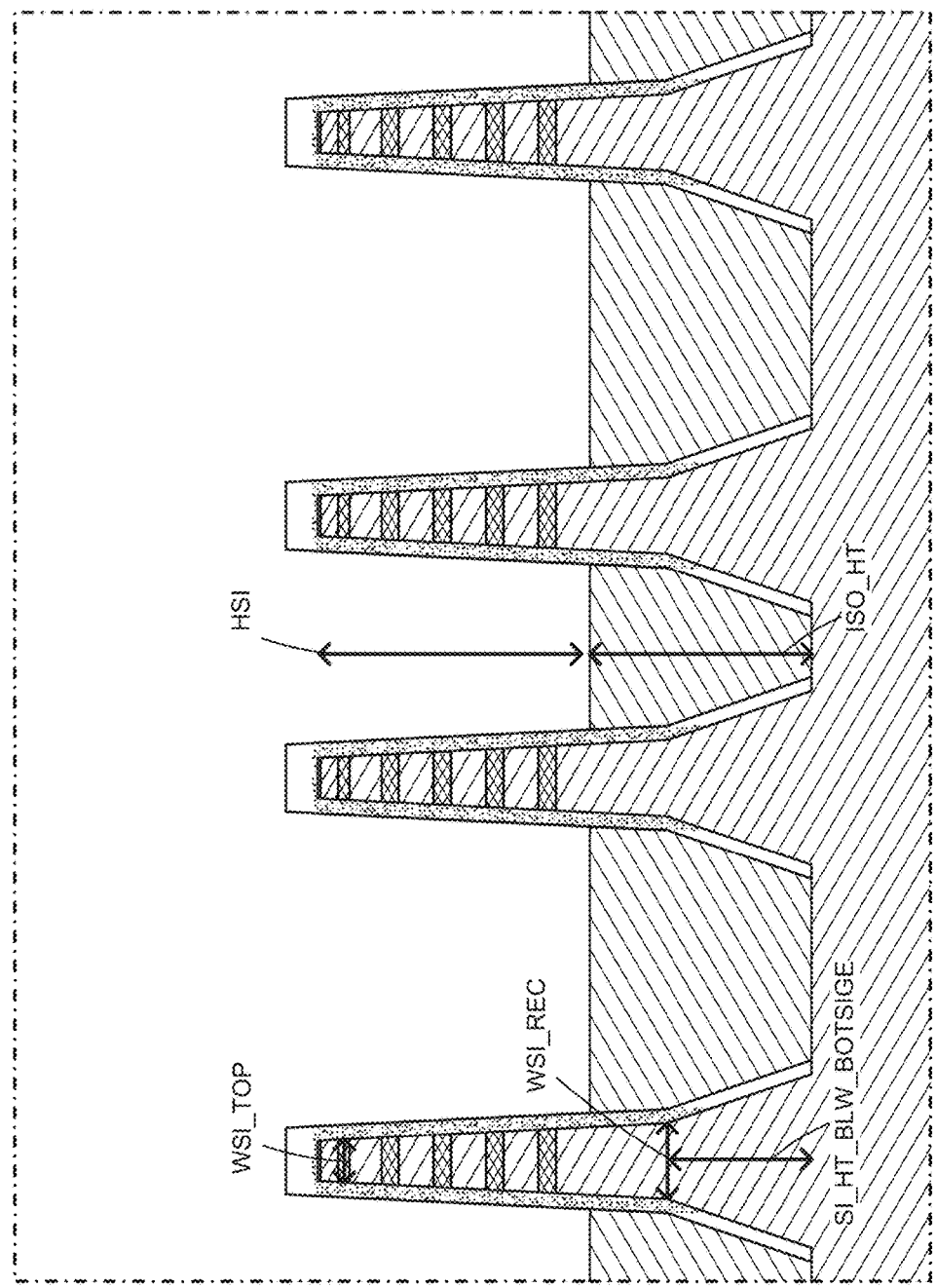
FIG. 6 illustrates an example cross-section view of a gate-all-around transistor with additional measurement parameters shown, in accordance with one or more example embodiments of the present disclosure.

Referring to FIG. 1, the gate-all-around transistor 100 may include, as a parameter to be measured, dimple recesses 102 representing depth of channels 104 with respect to a gate 106 surrounding the channels 104. The parameters may be measured and estimated for the gate-all-around transistor 100 (e.g., as shown in FIGS. 4-6). For example, table 140 shows PTSP parameters that may be measured prior to the DIMPLE etch portion of the fabrication process of the gate-all-around transistor 100. The parameters in table 140 may be input to a FFN 142, which may feed forward the parameters (e.g., measurements) of the table 140 to a ML model 144 (e.g., a DIMPLE etch recess model) trained with training data 146 to estimate DIMPLE etch recess depth. For example, the training data 146 may include process skews (e.g., SiGe %+ALD skews on individual nanowires) and collected TEM data from the gate-all-around transistor 100. The ML model 144 may avoid associating the parameters of the table 140 with optical data collected from the gate-all-around transistor 100 during the DIMPLE etch fabrication stage, and instead may generate a table 150 of parameters that include estimates of the dimple recess 102 and of an average of the dimple recesses 102 for the gate-all-around transistor 100.

In one or more embodiments, the parameters may be estimated by using scatterometry. The phase/intensity of incident light reflected/refracted by the gate-all-around transistor 100 may correspond to the parameters. The pre-DIMPLE etch parameters of table 140 may be fed forward to the DIMPLE etch portion of the fabrication process so that they do not need to be re-measured. In this manner, the pre-DIMPLE etch parameters of table 140 may be considered as unchanged by the DIMPLE etch parameters of table 150. Instead of re-measuring the pre-DIMPLE etch parameters of table 140 at the DIMPLE etch phase, the DIMPLE etch phase may add the DIMPLE recess 102 and average DIMPLE recess parameters for table 150.

In one or more embodiments, to generate the DIMPLE recess 102 and average DIMPLE recess parameters for table 150, the FFN 142 may be trained with a data set that may include one or more Germanium concentration skews and/or etch chemistry skews. The FFN 142 may only need training for one set of skews. In this manner, the FFN 142 may represent the existing ALLEGRO model trained using a feed forward technique on at least one set of wafer skews (e.g., the parameters of table 140 for a set of wafers).

Figure 2:
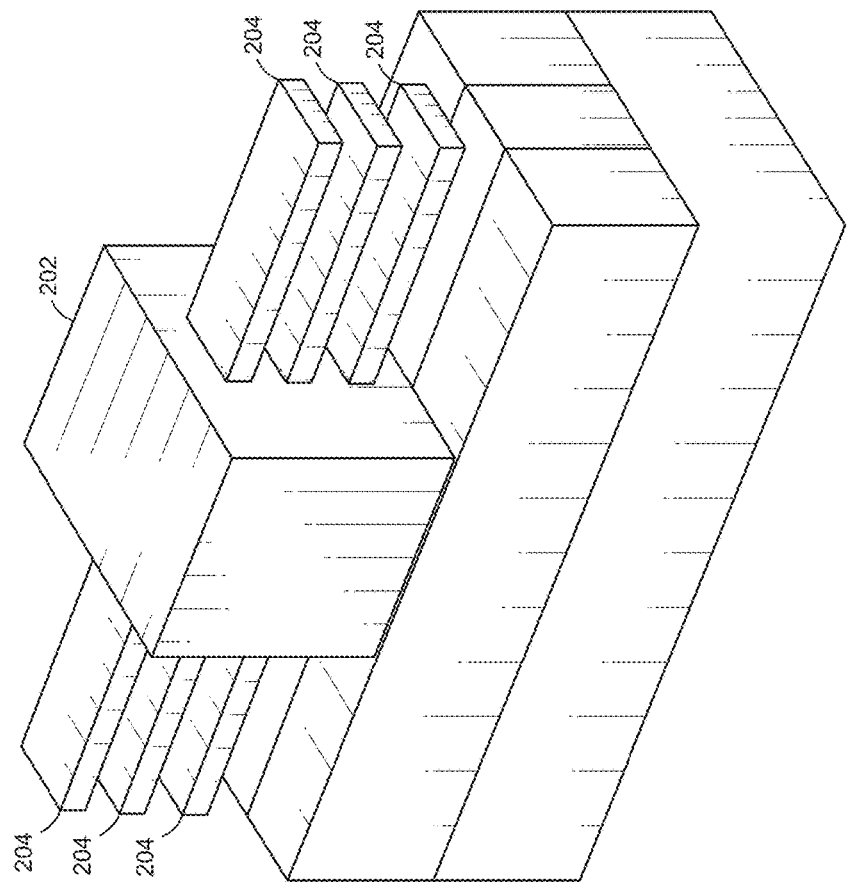
FIG. 2 illustrates an example gate-all-around transistor, in accordance with one or more example embodiments of the present disclosure.

FIG. 2 illustrates an example gate-all-around transistor 200, in accordance with one or more example embodiments of the present disclosure.

To understand the deficiencies of using the current ALLEGRO model with scatterometry measurements, FIG. 2 shows the gate-all-around transistor 200 as an example. As shown, the gate-all-around transistor 200 may include multiple channels 204 (e.g., nanowires), each completely surrounded at some portion by a gate 202, resulting in the DIMPLE recesses shown in FIG. 1 in between the channels 102. Because scatterometry relies on the phase/intensity of incident light reflected/refracted by a structure, such as the gate-all-around transistor 200, and because of the complex values of the light reflections/refractions, and the interference caused by the various light reflections/refractions, it is difficult to estimate the individual DIMPLE recesses of FIG. 1 rather than more simply providing an estimated average of the DIMPLE recesses. The FFN 142 of FIG. 1, because of its training on a data set of wafer parameters, may generate an accurate estimate of the multiple DIMPLE recesses and DIMPLE recess average for the gate-all-around transistor 200.

Figure 3:
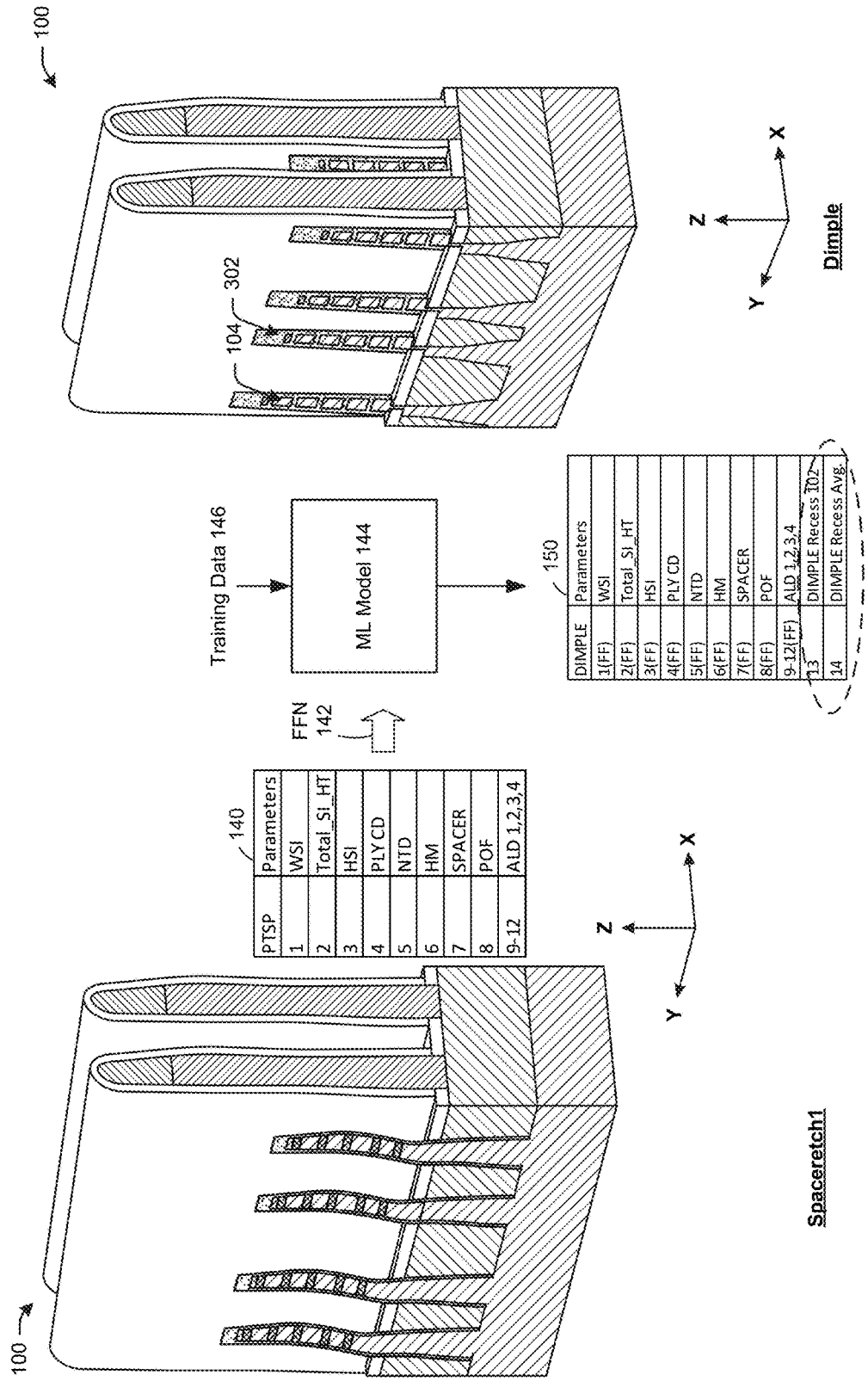
FIG. 3 illustrates an example cross-section view of the gate-all-around transistor of FIG. 1 during spacer etch and dimple etch processes using the feed forward technique of FIG. 1, in accordance with one or more example embodiments of the present disclosure.

FIG. 3 illustrates an example cross-section view of the gate-all-around transistor 100 of FIG. 1 during spacer etch and dimple etch processes using the feed forward technique of FIG. 1, in accordance with one or more example embodiments of the present disclosure.

Referring to FIG. 3, table 140 is shown with the parameters determined during the SPACER etch1 process. The parameters of table 140 may be fed forward using the FFN 142 of FIG. 1 and included in the table 150, which may add the parameters of DIMPLE recess 102 depth and average DIMPLE recess depth of all DIMPLE recesses of the gate-all-around transistor 100 in the DIMPLE process.

In the DIMPLE Etch process, SiGe 302 is etched out at different rates between the individual channels 104 (nanowires), resulting in the DIMPLE recesses 102 of FIG. 1. In this manner, the DIMPLE recesses 102 of FIG. 1 represent the indentations in the SiGe 302 resulting from the removal of the SiGe 302.

The SPACER etch1 process also may use a model to determine its parameters. To estimate the DIMPLE recesses 102 accurately, the FFN 142 may get rid of upstream fabrication process changes that may have occurred (e.g., at the SPACER etch1 process or earlier in the fabrication process. At SPACER etch1, prior to the DIMPLE etch, the DIMPLE recess has not occurred yet, but the ALD dimensions have been defined, along with the other parameters of table 140. Because the parameters of table 140, such as poly Si (e.g., having similar optical constants as Si), may have similar optical constants as Si and SiGe, and therefore may confuse the DIMPLE recess measurements, may be removed from the DIMPLE etch process. By removing the parameters of the table 140 from the DIMPLE etch process by using the FFN 142, the DIMPLE recess estimates of the DIMPLE etch process may not be undermined by the parameters based on similar optical properties, and therefore may be more accurate. Therefore, the ML model 144 at the DIMPLE etch stage does not change the parameters of the table 140 fed forward from the SPACER etch1 stage, but can change the DIMPLE recesses 102. In this manner, when incident light is applied to the gate-all-around transistor 100 at the DIMPLE etch stage, the reflections/refractions of the light can be de-correlated from the parameters of the table 140, avoiding an confusion regarding whether the optical signatures of the reflections/refractions correlate to the DIMPLE recesses 102 or to other parameters that are already determined because they have been fed forward.

FIG. 4 illustrates the example cross-section view of the gate-all-around transistor 100 of FIG. 1 with additional measurement parameters shown, in accordance with one or more example embodiments of the present disclosure.

Referring to FIG. 4, parameters fed forward from the SPACER etch1 process of FIG. 3 (e.g., in addition to the parameters of the table 140) are shown, including a hard mask (HM) dimension, a poly-fin absorb (poly_ab_fin) dimension, a poly Si dimension (PLY_2SPCR), a SPACER thickness (SPR THK), a POLY plus Si dimension (PLY+SPR2), atomic layer depositions (ALD1-ALD4) dimension, a bottom fin width (POBCD), and a negative tone development (NTD) dimension.

FIG. 5 illustrates an example image (e.g., TEM image) of the gate-all-around transistor 100 of FIG. 1 with dimple and other measurement parameters shown, in accordance with one or more example embodiments of the present disclosure.

Referring to FIG. 5, the ALD dimensions ALD1-ALD4 are shown, along with the DIMPLE recesses above and below each ALD (e.g., NW1_DIMPLE-NW5_DIMPLE).

In the DIMPLE etch process, the SiGe is removed (e.g., the SiGe 302 of FIG. 3), preserving the silicon (e.g., the ALD1-ALD4) nanowires, representing the channels 104 of FIG. 1.

Still referring to FIG. 5, the DIMPLES are on SiGe (e.g., as shown in FIG. 3). For optical techniques like scatterometry, Si and SiGe have very similar dispersion (e.g., optical constants). Therefore, a change in DIMPLE recess may be confused with a change in ALD dimensions, and vice versa.

FIG. 6 illustrates an example cross-section view of a gate-all-around transistor 600 with additional measurement parameters shown, in accordance with one or more example embodiments of the present disclosure.

Referring to FIG. 6, parameters fed forward from the SPACER etch1 process of FIG. 3 (e.g., including parameters in addition to the parameters of the table 140) are shown, including a WSi silicon top portion parameter (WSI_TOP), a WSi silicon recess parameter (WSI_REC), a silicon below bottom SiGe parameter (SI_HT_BLW_BOTSIGE), an silicon height parameter (HSI), and a trench isolation height parameter (ISO_HT). The parameters of FIG. 6 may be fed forward (e.g., using the FFN 142 of FIG. 1) to the DIMPLE etch process.

Figure 7:
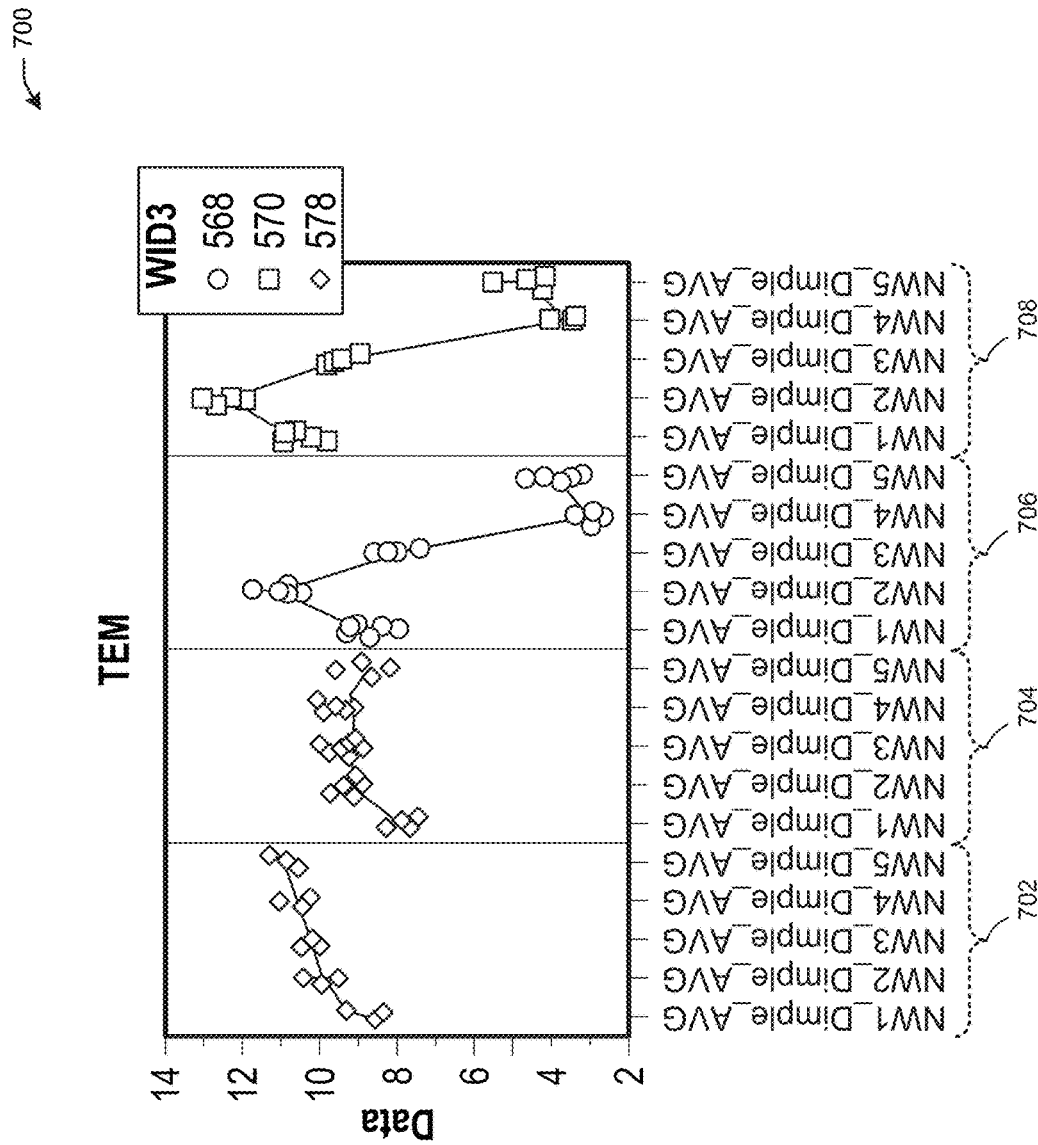
FIG. 7 is an example plot of a machine learning model performance trained using transmission electron microscope data for measuring dimples of the gate-all-around transistor of FIG. 1, in accordance with one or more example embodiments of the present disclosure.

FIG. 7 is an example plot 700 of a machine learning model performance trained using transmission electron microscope data for measuring dimples of the gate-all-around transistor of FIG. 1, in accordance with one or more example embodiments of the present disclosure.

Referring to FIG. 7, the data on the vertical axis represents the average DIMPLE recess depth (e.g., in nanometers) for each nanowire (e.g., channel 104 of FIG. 1) for different structures and epitaxial layers (e.g., percentages of Ge). For example, DIMPLE recess averages 702, 704, 706, and 708 may be for the same nanowires, but based on training using different structures and epitaxial layers for the nanowires.

Figure 8:
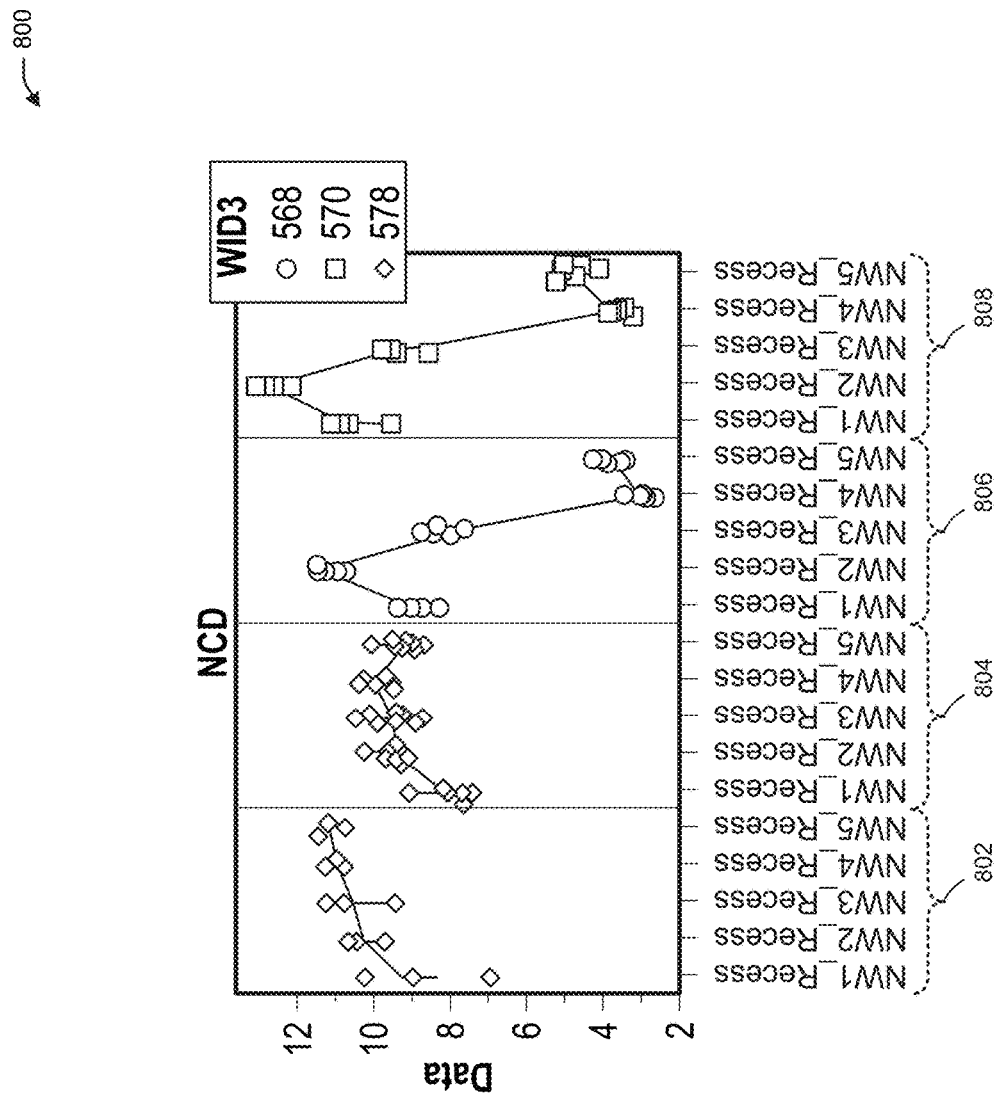
FIG. 8 is an example plot of the machine learning model performance trained using nanocluster deposition data for measuring dimples of the gate-all-around transistor of FIG. 1, in accordance with one or more example embodiments of the present disclosure.

FIG. 8 is an example plot 800 of the machine learning model performance trained using nanocluster deposition data for measuring dimples of the gate-all-around transistor of FIG. 1, in accordance with one or more example embodiments of the present disclosure.

Referring to FIG. 8, the data on the vertical axis represents the average DIMPLE recess depth (e.g., in nanometers) for each nanowire (e.g., channel 104 of FIG. 1) for different structures and epitaxial layers (e.g., percentages of Ge). For example, DIMPLE recess averages 802, 804, 806, and 808 may be for the same nanowires, but based on training using different structures and epitaxial layers for the nanowires.

Referring to FIG. 7 and FIG. 8, using the Ge concentration skews of Table 1 as training data results in breaking the correlation between the different DIMPLE recesses. For example, the DIMPLE recess averages 706 and 708, and 806 and 808 may be based on one of the Ge concentration skews (e.g., ZZ1), whereas the DIMPLE recess averages 702 and 704, and 802 and 804 may be trained using different DIMPLE etch chemistries.

Figure 9:
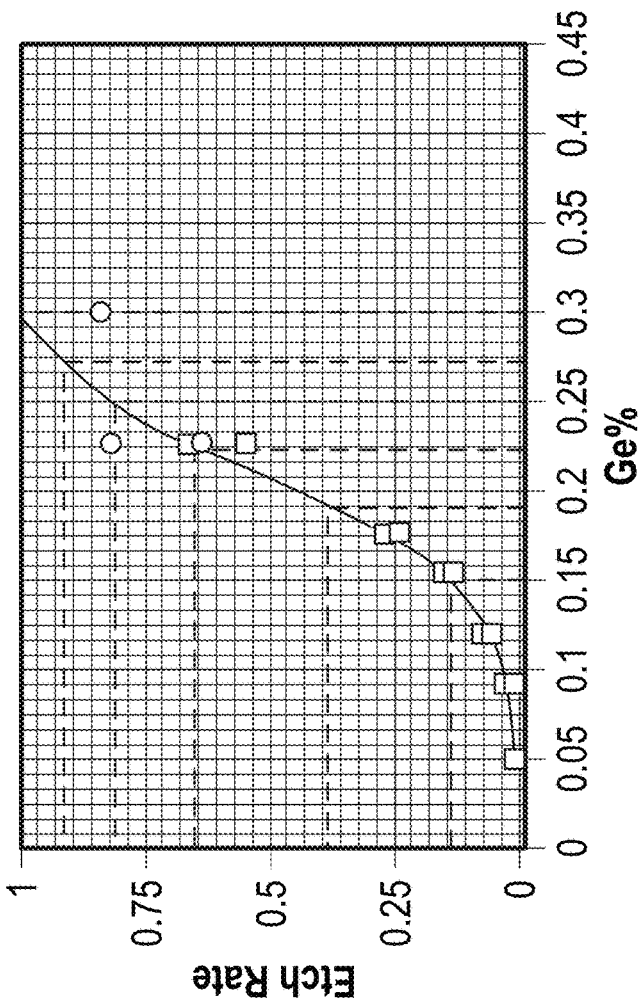
FIG. 9 is an example plot of the machine learning model performance in terms of etch rate, in accordance with one or more example embodiments of the present disclosure.

FIG. 9 is an example plot 900 of the machine learning model performance in terms of etch rate, in accordance with one or more example embodiments of the present disclosure.

As shown in FIG. 9, given a Ge % (e.g., based on the training data of Table 1 above), the ML model 144 of FIG. 1 may generate an etch rate based on certain conditions, such as the temperature and a chemistry (e.g., F+Cl).

Figure 10:
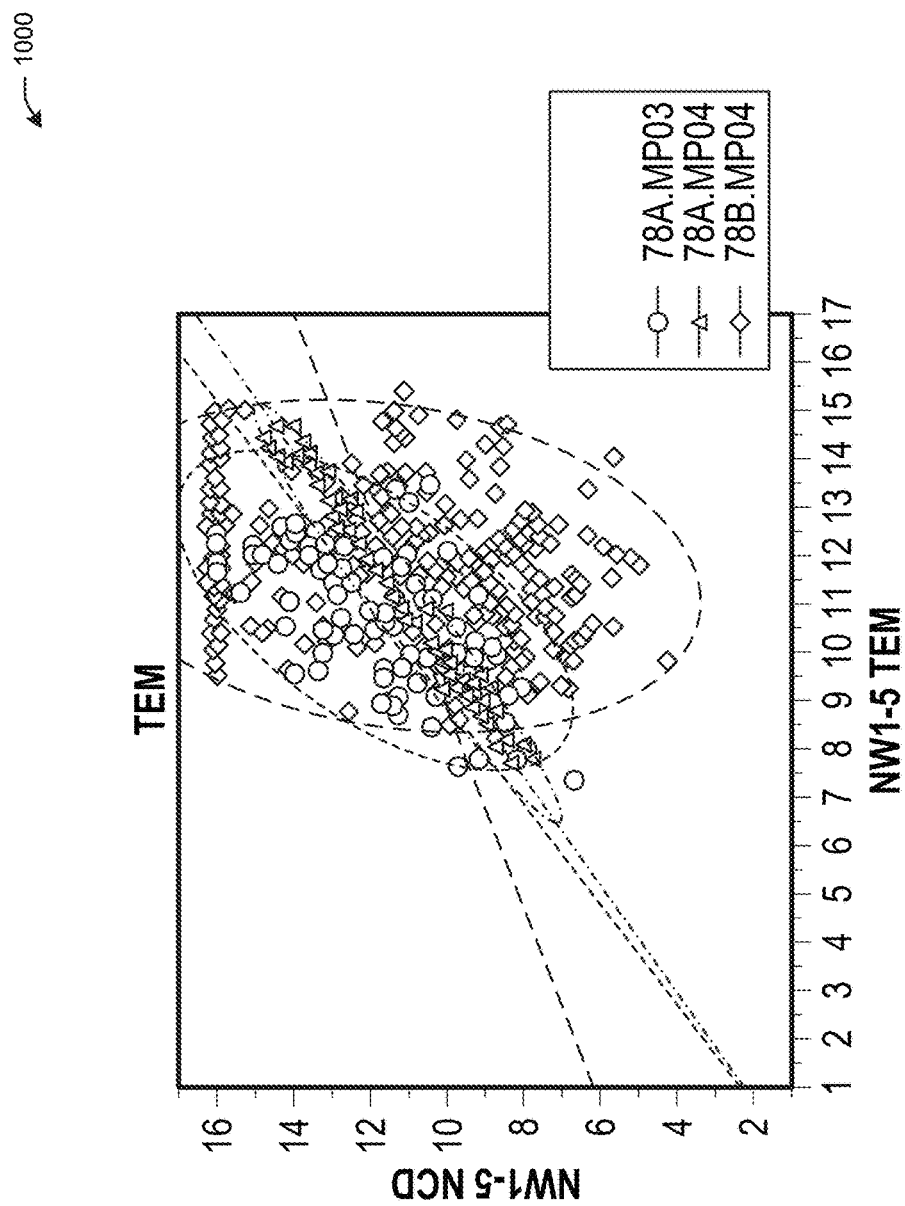
FIG. 10 is an example plot of the machine learning model performance as a standalone model trained using transmission electron microscope data for measuring dimples of the gate-all-around transistor of FIG. 1, in accordance with one or more example embodiments of the present disclosure.

FIG. 10 is an example plot 1000 of the machine learning model performance as a standalone model trained using transmission electron microscope data for measuring dimples of the gate-all-around transistor of FIG. 1, in accordance with one or more example embodiments of the present disclosure.

Referring back to FIG. 7, the ML model performance appears strong for the DIMPLE recess averages 706 and 708 in particular. However, referring to FIG. 10, the NCD DIMPLE recess averages of FIG. 7 in comparison to the TEM DIMPLE recess averages of FIG. 8 do not correlate well when the ML model is used as a standalone model (e.g., without a feed forward approach).

Figure 11:
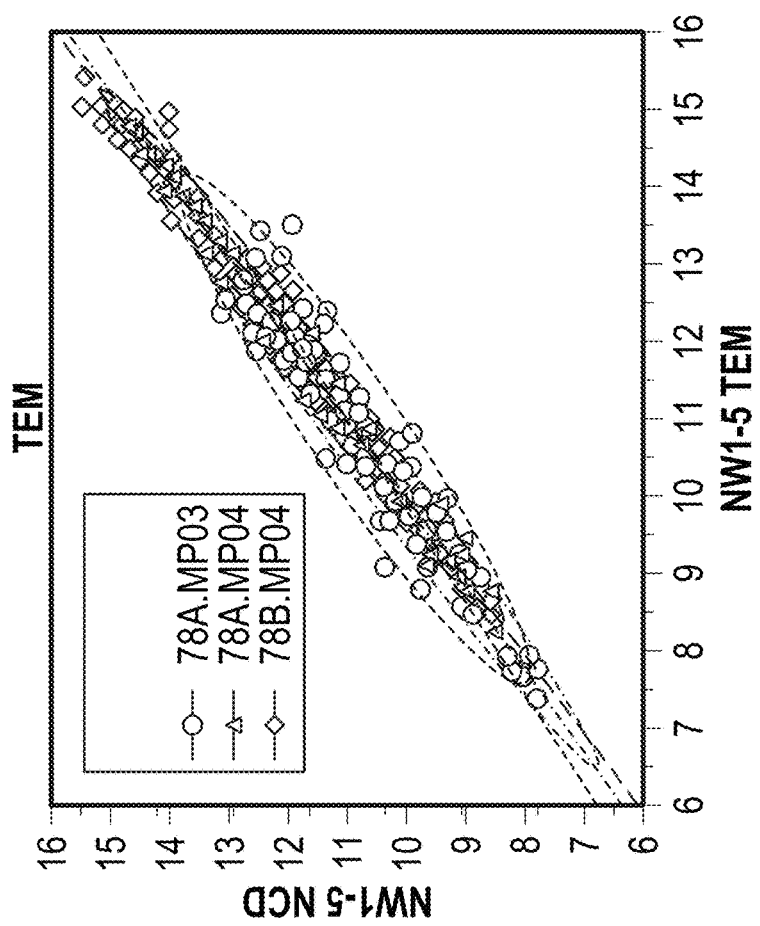
FIG. 11 is an example plot of a feed forward model performance using transmission electron microscope data for measuring dimples of the gate-all-around transistor of FIG. 1, in accordance with one or more example embodiments of the present disclosure.

FIG. 11 is an example plot 1100 of a feed forward model performance using transmission electron microscope data for measuring dimples of the gate-all-around transistor of FIG. 1, in accordance with one or more example embodiments of the present disclosure.

Referring back to FIG. 1, when the ML model 144 is used in combination with the FFN 142, the performance as shown in FIG. 11 is improved with respect to FIG. 10. In particular, the correlation between the TEM DIMPLE recess averages of FIG. 8 and the NCD DIMPLE recess averages of FIG. 7 is stronger than the correlation shown in FIG. 10. The stronger correlation is a result of using the ML model 144 in combination with the FFN 142. One reason for the stronger correlation is that the feed forward approach captures upstream variations in the fabric flow because the previously generated parameters are fed forward to the DIMPLE etch portion of the flow.

Figure 12:
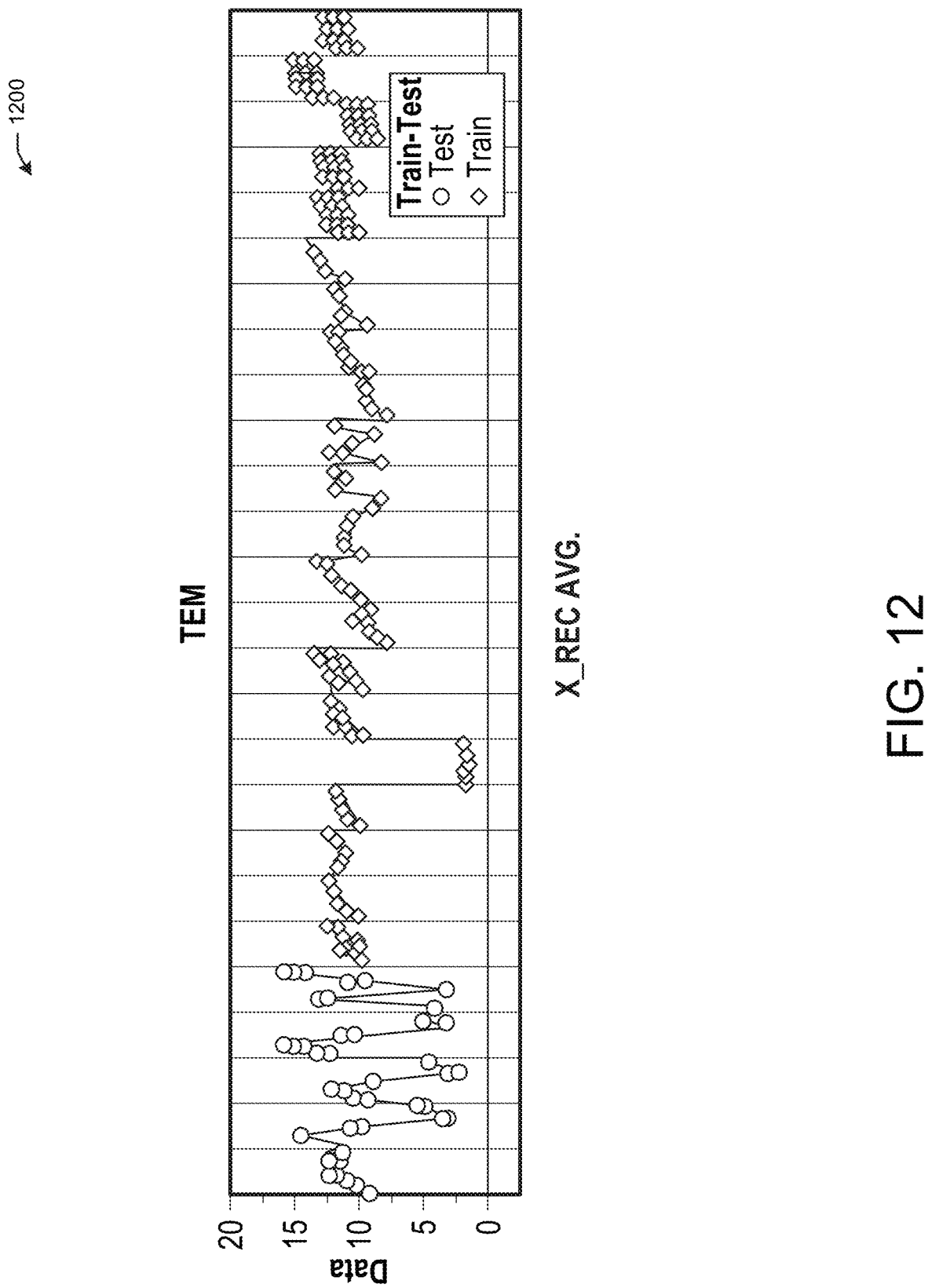
FIG. 12 is an example plot of the machine learning model performance compared to training using transmission electron microscope data for measuring dimples of the gate-all-around transistor of FIG. 1, in accordance with one or more example embodiments of the present disclosure.

FIG. 12 is an example plot 1200 of the machine learning model performance compared to training using transmission electron microscope data for measuring dimples of the gate-all-around transistor of FIG. 1, in accordance with one or more example embodiments of the present disclosure.

Figure 13:
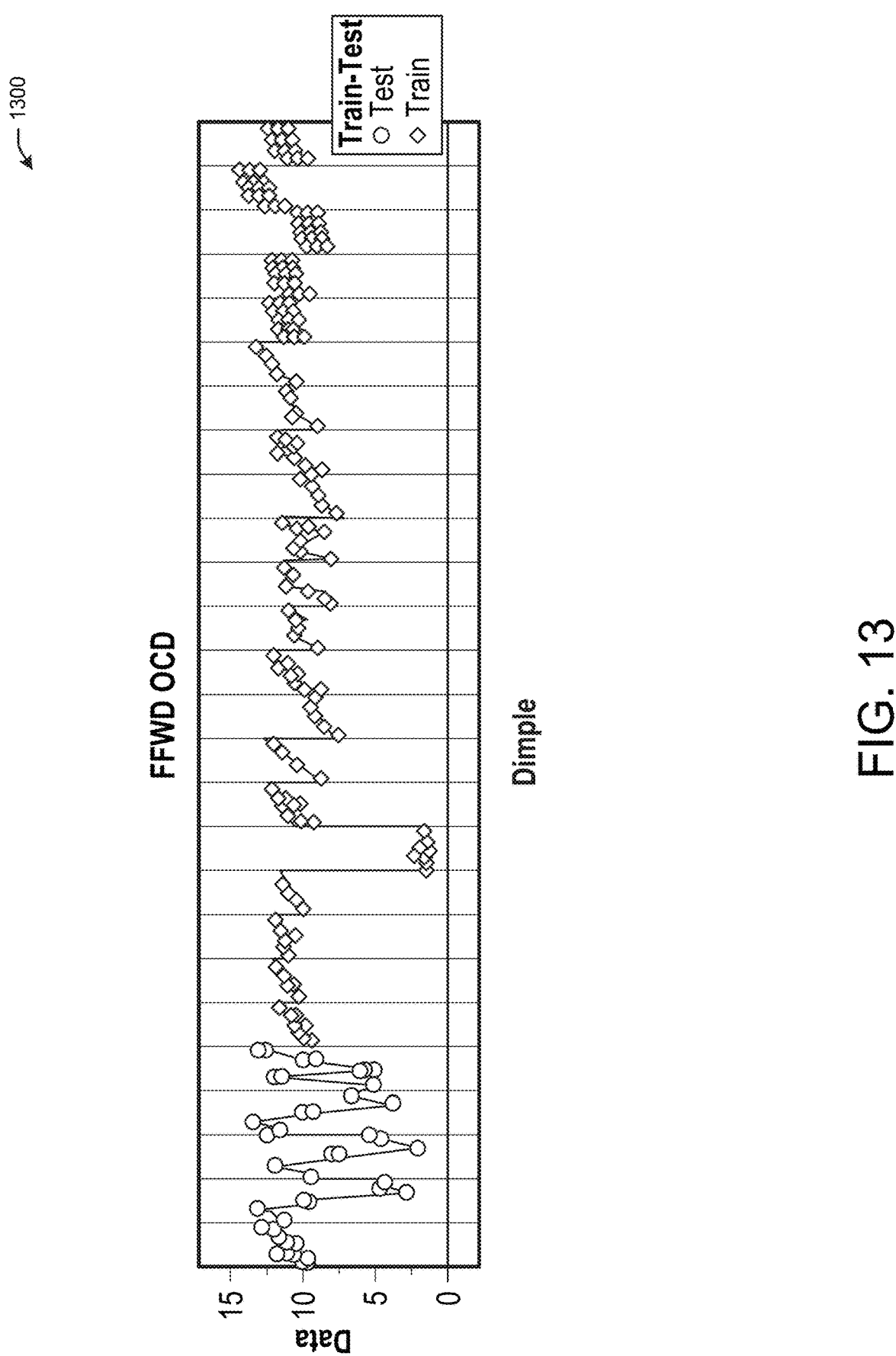
FIG. 13 is an example plot of the feed forward model performance compared to training using transmission electron microscope data for measuring dimples of the gate-all-around transistor of FIG. 1, in accordance with one or more example embodiments of the present disclosure.

FIG. 13 is an example plot 1300 of the feed forward model performance compared to training using transmission electron microscope data for measuring dimples of the gate-all-around transistor of FIG. 1, in accordance with one or more example embodiments of the present disclosure.

Referring to FIG. 13, the ML model using the feed forward approach (e.g., as shown in FIG. 1) results in an improved correlation using different wafers (e.g., with respect to FIG. 12 that does not use the feed forward approach).

Figure 14:
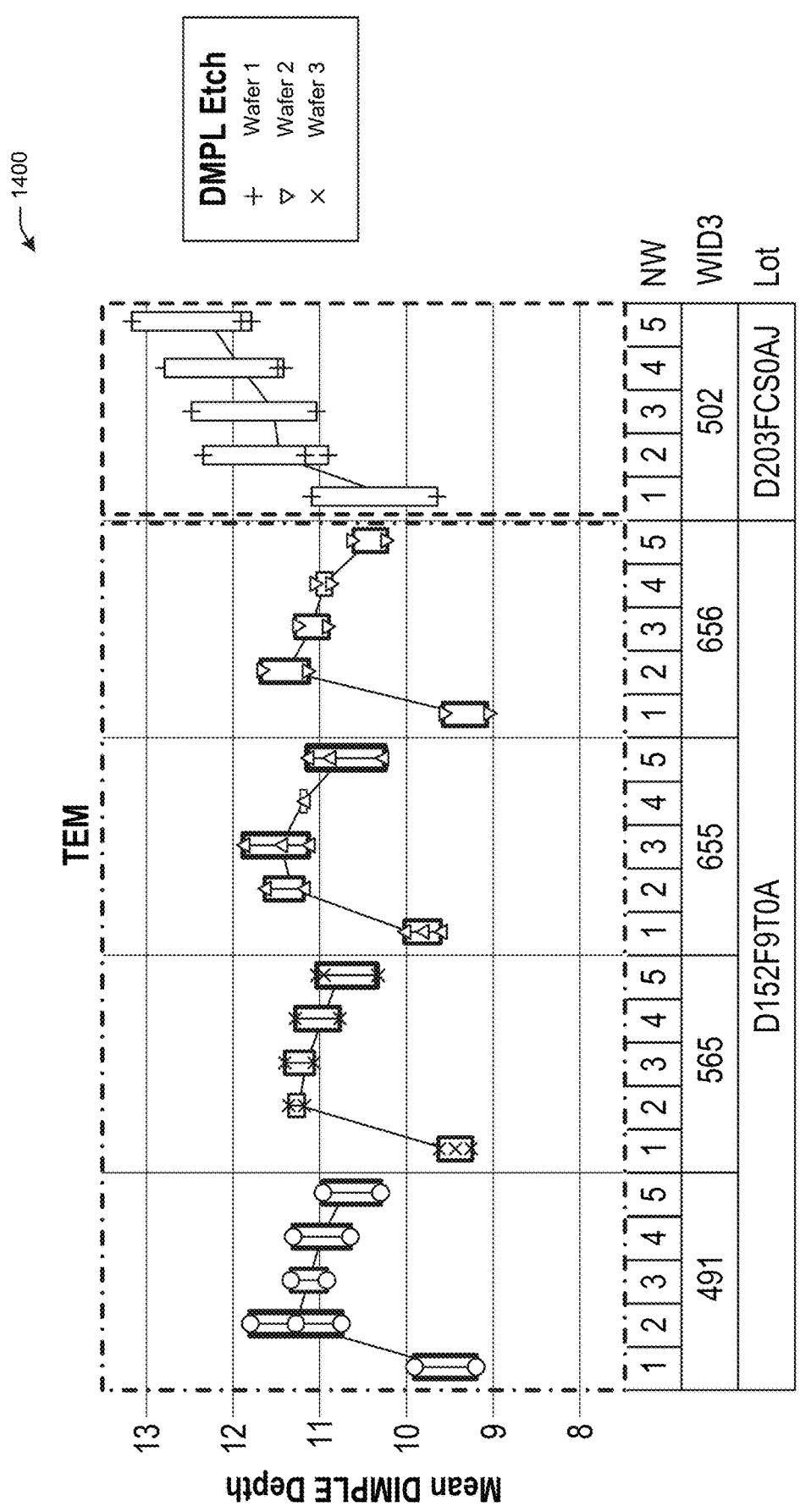
FIG. 14 is an example plot of dimple recess prediction using the machine learning model, in accordance with one or more example embodiments of the present disclosure.

FIG. 14 is an example plot 1400 of dimple recess prediction using the machine learning model, in accordance with one or more example embodiments of the present disclosure.

Figure 15:
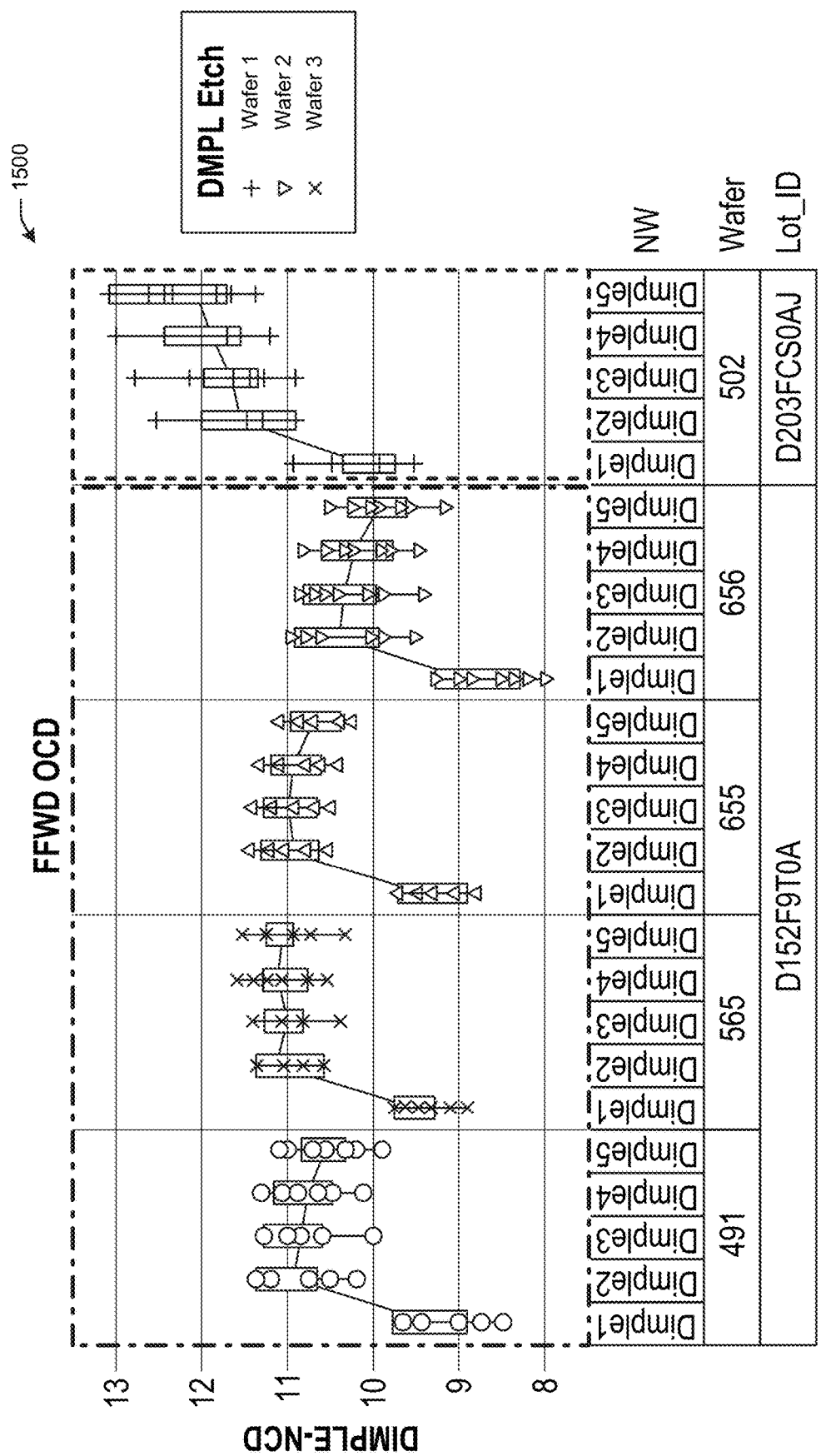
FIG. 15 is an example plot of dimple recess prediction using the feed forward model, in accordance with one or more example embodiments of the present disclosure.

FIG. 15 is an example plot 1500 of dimple recess prediction using the feed forward model, in accordance with one or more example embodiments of the present disclosure.

Referring to FIG. 14, the plot 1400 shows the mean DIMPLE recess depth (e.g., in nanometers) for different etch profiles/processes. FIG. 15 shows the DIMPLE depth using NCD data for different etch chemistries. Using the feed forward approach in FIG. 15 (e.g., as shown in FIG. 1), training may be required only on one set of skews, and the prediction accuracy for different wafers is shown to be strong. Due to the upstream process changes (e.g., changes in the fabrication process) being absorbed by the feed forward model, FIG. 15 shows that the feed forward model is more robust and stable, and is the best way to avoid model changes with process revisions, when compared to a stand-alone ML performance whose performance is represented by FIG. 14.

Figure 16:
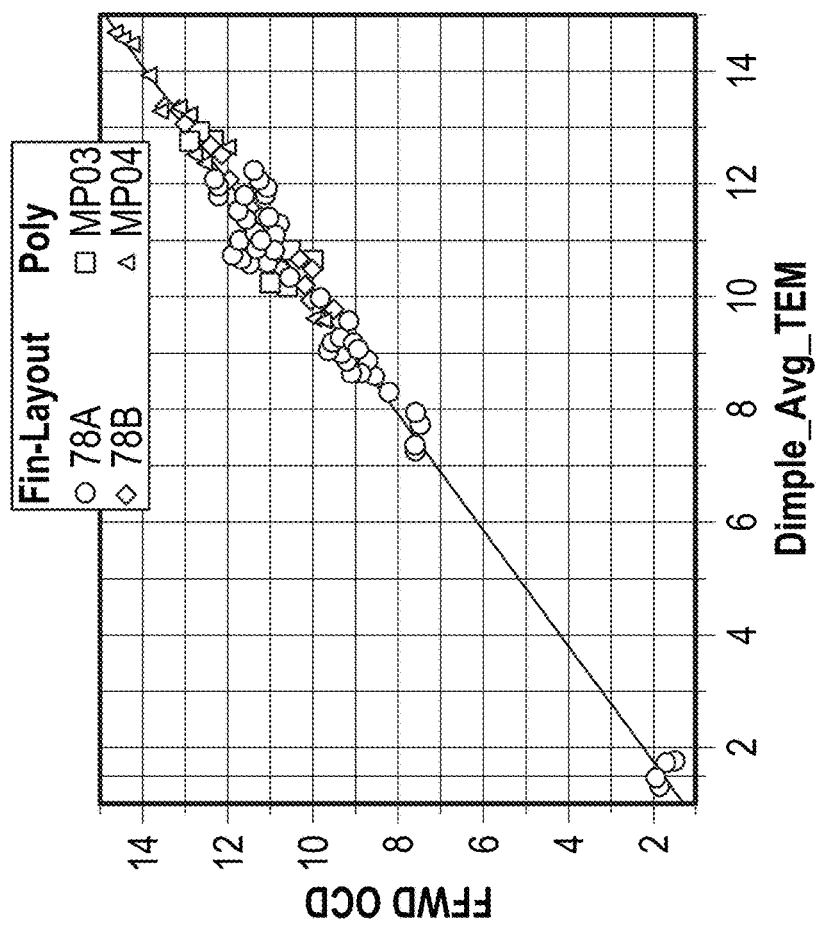
FIG. 16 is an example plot of dimple recess average prediction using the feed forward model, in accordance with one or more example embodiments of the present disclosure.

FIG. 16 is an example plot 1600 of dimple recess average prediction using the feed forward model, in accordance with one or more example embodiments of the present disclosure.

Referring back to FIG. 1, when the ML model 144 is used in combination with the FFN 142, the performance as shown in FIG. 15 shows a strong correlation between the DIMPLE recess averages determined using the ML with the feed forward technique and the DIMPLE recess averages based on the TEM data. The stronger correlation is a result of using the ML model 144 in combination with the FFN 142. One reason for the stronger correlation is that the feed forward approach captures upstream variations in the fabric flow because the previously generated parameters are fed forward to the DIMPLE etch portion of the flow.

Figure 17:
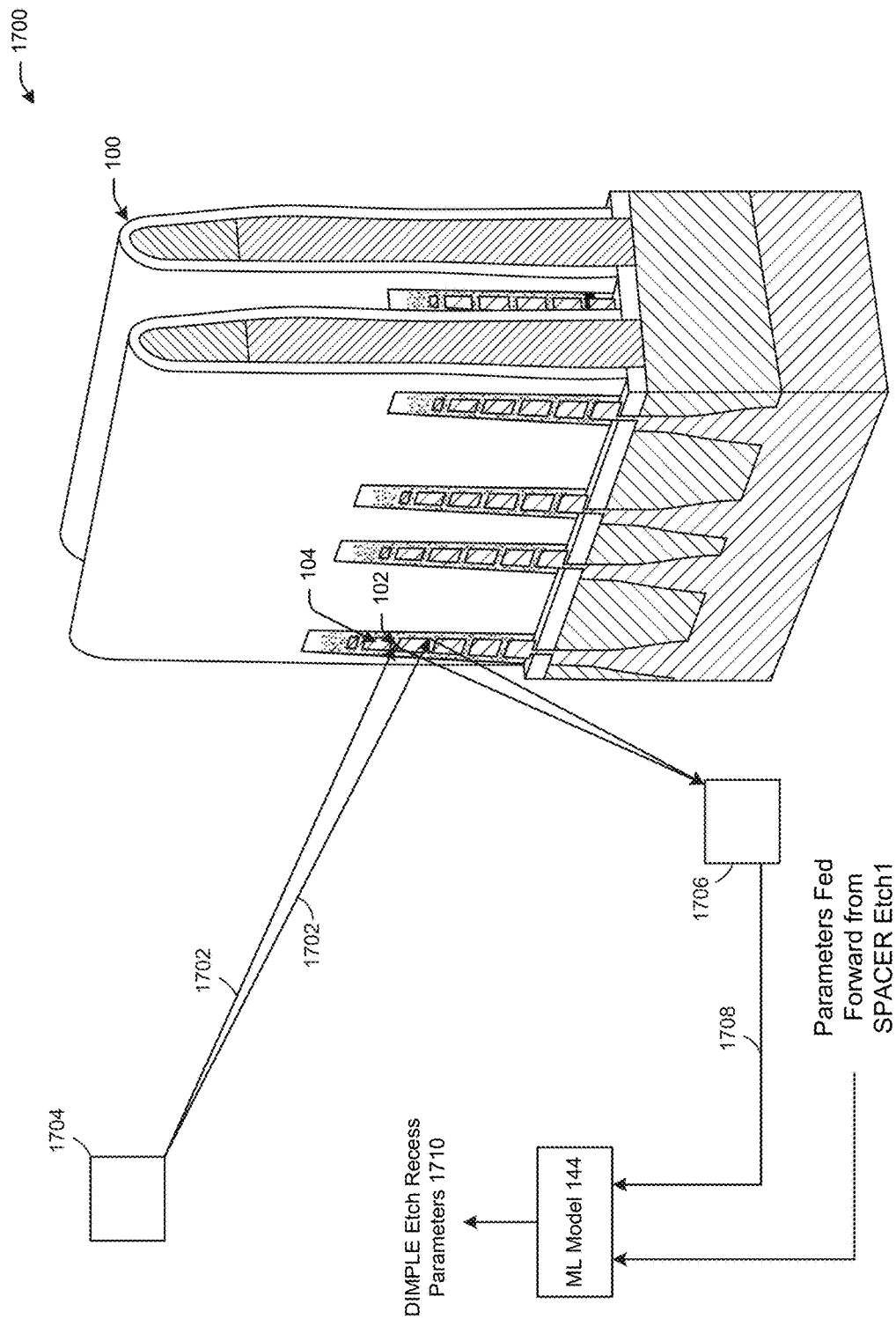
FIG. 17 illustrates an example system for estimating dimple recess depth in gate-all-around transistor of FIG. 1 using a feed forward technique, in accordance with one or more example embodiments of the present disclosure.

FIG. 17 illustrates an example system 1700 for estimating dimple recess depth in the gate-all-around transistor 100 of FIG. 1 using a feed forward technique, in accordance with one or more example embodiments of the present disclosure.

Referring to FIG. 17, light 1702 directed from a light source 1704 (e.g., a laser) may reflect/refract from surfaces of the gate-all-around transistor 100, including in the channels 104 and the DIMPLE recesses 102. The reflected/refracted light 1702 may be detected by a light detector 1706 (e.g., a photo detector or photodiode), and input as optical data 1708 of the DIMPLE etch fabrication stage to the ML model 144. Because the parameters of the SPACER Etch1 fabrication stage (e.g., from table 140 of FIG. 1) may be fed forward to the ML model 144 from the SPACER Etch1 stage, the ML model 144 may include the fed forward SPACER Etch1 parameters in the parameters generated at the DIMPLE etch fabrication stage (e.g., the parameters of table 150 of FIG. 1). In particular, when the ML model 144 compares the optical signatures of the optical data 1708 to known optical signatures (e.g., from training data and/or learned optical signatures), the ML model 144 may disassociate the optical data 1708 from the fed forward SPACER Etch1 parameters. Instead, the ML model 144 may determine DIMPLE etch recess depths that correspond to the optical data 1708 without consideration of whether the optical data 1708 corresponds to the fed forward SPACER Etch1 parameters, thereby avoiding potential confusion of whether the optical data 1708 corresponds to the fed forward SPACER Etch1 parameters or to DIMPLE etch recess depths. As a result, the ML model 144 may generate DIMPLE etch recess parameters 1710 (e.g., the parameters of the table 150 of FIG. 1), including the fed forward SPACER Etch1 parameters (e.g., which do not change), and the DIMPLE etch recess depths/average depths.

Referring to FIG. 1 and FIG. 17, a general process flow may include designing a fabrication process skew (e.g., SiGe %+ALD skews on individual nanowires), collecting TEM data (e.g., included in the training data 146 of FIG. 1), such as from the image of FIG. 5, collecting the optical data 1708 (e.g., at the same location where the TEM data are collected), training the ML model 144 on the TEM data and process skew data, feeding forward the SPACER etch1 parameters to the ML model 144, and generating the DIMPLE etch recess parameters 1710 based on the inputs and training data 146.

Figure 18:
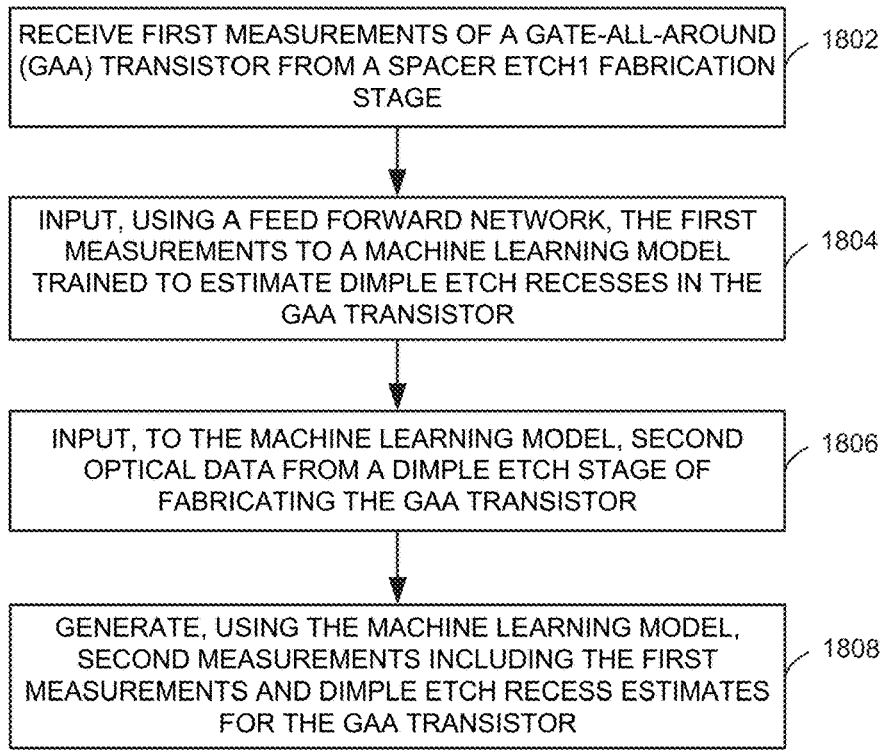
FIG. 18 illustrates a flow diagram of illustrative process for estimating dimple recess depth in gate-all-around transistors using a feed forward technique, in accordance with one or more example embodiments of the present disclosure.

FIG. 18 illustrates a flow diagram of illustrative process 1800 for estimating dimple recess depth in gate-all-around transistors using a feed forward technique, in accordance with one or more example embodiments of the present disclosure.

At block 1802, a device (e.g., the transistor measurement devices 1909 of FIG. 9) may receive first measurements (e.g., the parameters of table 140 of FIG. 1) from a SPACER etch1 fabrication stage of a GAA transistor (e.g., as shown in FIG. 3). The first measurements may include dimensions of polysilicon, for example.

At block 1804, the device may input, using a FFN (e.g., the FFN 142 of FIG. 1) the first measurements to a machine learning model (e.g., the ML model 144 of FIG. 1) trained to estimate DIMPLE etch recess depths in a DIMPLE etch stage of the GAA fabrication. By feeding forward the first measurements from the SPACER etch1 stage, the machine learning model may de-correlate the optical data analyzed in the DIMPLE etch stage from the first measurements so that the first measurements do not need to be re-measured and so that the optical data of the DIMPLE etch stage is not confused with the optical signatures corresponding to the first measurements.

At block 1806, the device may input, to the ML model at the DIMPLE etch stage, optical data from the DIMPLE etch stage (e.g., as shown in FIG. 17). The optical data may be detected at the locations where TEM data (e.g., FIG. 5) is captured and used to train the ML model.

At block 1808, based on the first parameters and DIMPLE etch optical data input to the ML model, the ML model may generate second measurements for the GAA (e.g., the parameters of the table 150 of FIG. 1). The second parameters may include the fed forward parameters of the SPACER etch1 stage, unaltered, DIMPLE etch recesses of individual DIMPLE etch recesses of the GAA, and average DIMPLE etch recess depths of the GAA.

The examples herein are not meant to be limiting.

Figure 19:
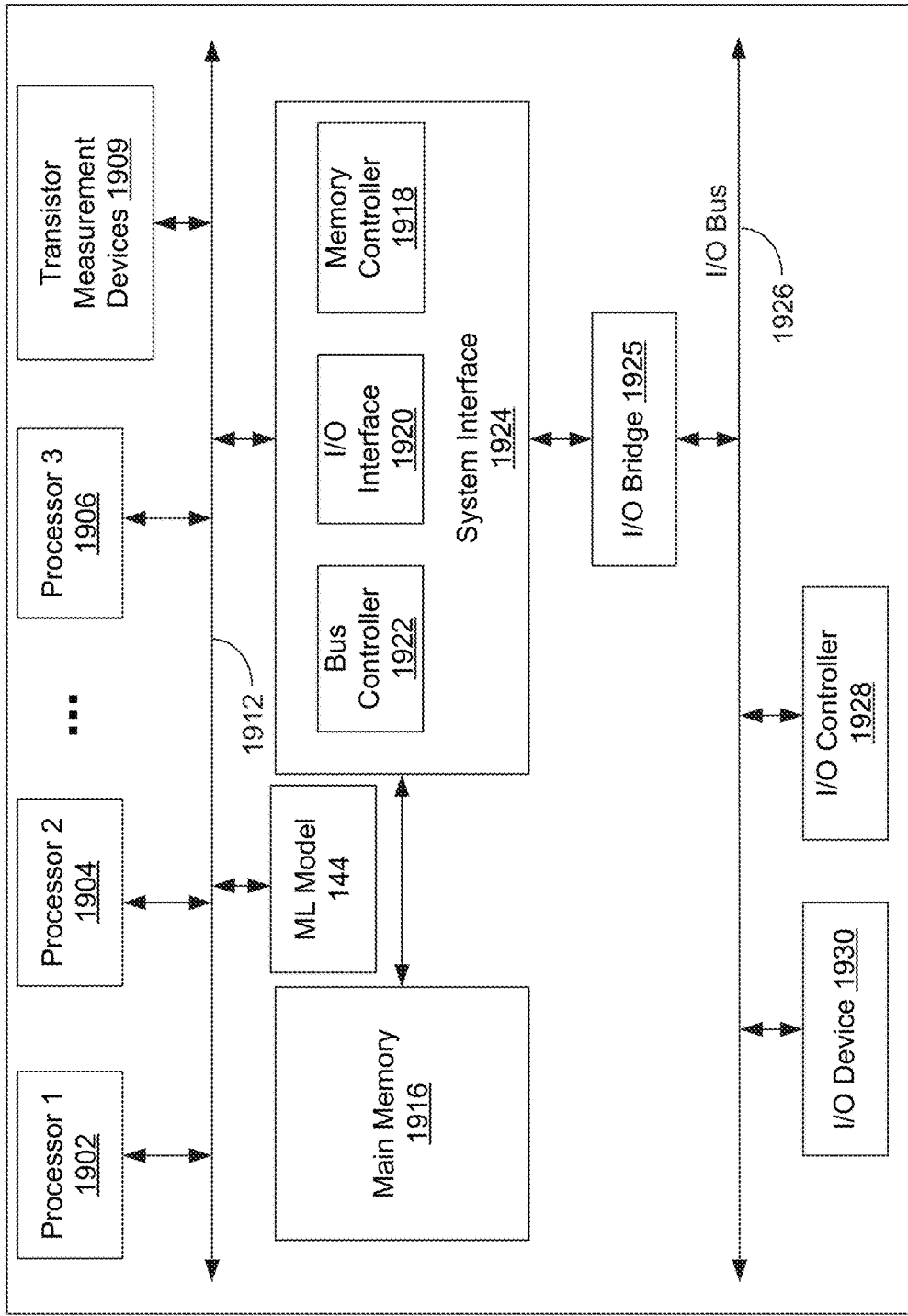
FIG. 19 is a diagram illustrating an example of a computing system, in accordance with one or more example embodiments of the present disclosure.

FIG. 19 is a diagram illustrating an example of a computing system 1900, which may be used in implementing the embodiments of the components of the network disclosed above. For example, the computing system 1900 of FIG. 19 may include the ML model 144 and the FFN 142 of FIG. 1. The computer system (system) includes one or more processors 1902-1906, and one or more transistor measurement devices 1909 (e.g., capable of performing the process 1800 of FIG. 18. Processors 1902-1906 may include one or more internal levels of cache (not shown) and a bus controller 1922 or bus interface unit to direct interaction with the processor bus 1912. Processor bus 1912, also known as the host bus or the front side bus, may be used to couple the processors 1902-1906 with the system interface 1924. System interface 1924 may be connected to the processor bus 1912 to interface other components of the system 1900 with the processor bus 1912. For example, system interface 1924 may include a memory controller 1918 for interfacing a main memory 1916 with the processor bus 1912. The main memory 1916 typically includes one or more memory cards and a control circuit (not shown). System interface 1924 may also include an input/output (I/O) interface 1920 to interface one or more I/O bridges 1925 or I/O devices with the processor bus 1912. One or more I/O controllers and/or I/O devices may be connected with the I/O bus 1926, such as I/O controller 1928 and I/O device 1930, as illustrated.

I/O device 1930 may also include an input device (not shown), such as an alphanumeric input device, including alphanumeric and other keys for communicating information and/or command selections to the processors 1902-1906. Another type of user input device includes cursor control, such as a mouse, a trackball, or cursor direction keys for communicating direction information and command selections to the processors 1902-1906 and for controlling cursor movement on the display device.

System 1900 may include a dynamic storage device, referred to as main memory 1916, or a random access memory (RAM) or other computer-readable devices coupled to the processor bus 1912 for storing information and instructions to be executed by the processors 1902-1906. Main memory 1916 also may be used for storing temporary variables or other intermediate information during execution of instructions by the processors 1902-1906. System 1900 may include a read only memory (ROM) and/or other static storage device coupled to the processor bus 1912 for storing static information and instructions for the processors 1902-1906. The system outlined in FIG. 19 is but one possible example of a computer system that may employ or be configured in accordance with aspects of the present disclosure.

According to one embodiment, the above techniques may be performed by computer system 1900 in response to processor 1904 executing one or more sequences of one or more instructions contained in main memory 1916. These instructions may be read into main memory 1916 from another machine-readable medium, such as a storage device. Execution of the sequences of instructions contained in main memory 1916 may cause processors 1902-1906 to perform the process steps described herein. In alternative embodiments, circuitry may be used in place of or in combination with the software instructions. Thus, embodiments of the present disclosure may include both hardware and software components.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

A data processing system suitable for storing and/or executing program code will include at least one processor coupled directly or indirectly to memory elements through a system bus. The memory elements can include local memory employed during actual execution of the program code, bulk storage, and cache memories that provide temporary storage of at least some program code to reduce the number of times code must be retrieved from bulk storage during execution. The term "code" covers a broad range of software components and constructs, including applications, drivers, processes, routines, methods, modules, firmware, microcode, and subprograms. Thus, the term "code" may be used to refer to any collection of instructions that, when executed by a processing system, perform a desired operation or operations.

Logic circuitry, devices, and interfaces herein described may perform functions implemented in hardware and implemented with code executed on one or more processors. Logic circuitry refers to the hardware or the hardware and code that implements one or more logical functions. Circuitry is hardware and may refer to one or more circuits. Each circuit may perform a particular function. A circuit of the circuitry may comprise discrete electrical components interconnected with one or more conductors, an integrated circuit, a chip package, a chip set, memory, or the like. Integrated circuits include circuits created on a substrate such as a silicon wafer and may comprise components. Integrated circuits, processor packages, chip packages, and chipsets may comprise one or more processors.

Processors may receive signals such as instructions and/or data at the input(s) and process the signals to generate at least one output. While executing code, the code changes the physical states and characteristics of transistors that make up a processor pipeline. The physical states of the transistors translate into logical bits of ones and zeros stored in registers within the processor. The processor can transfer the physical states of the transistors into registers and transfer the physical states of the transistors to another storage medium.

A processor may comprise circuits to perform one or more sub-functions implemented to perform the overall function of the processor. One example of a processor is a state machine or an application-specific integrated circuit (ASIC) that includes at least one input and at least one output. A state machine may manipulate the at least one input to generate the at least one output by performing a predetermined series of serial and/or parallel manipulations or transformations on the at least one input.

The logic as described above may be part of the design for an integrated circuit chip. The chip design is created in a graphical computer programming language, and stored in a computer storage medium or data storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a processor board, a server platform, or a motherboard, or (b) an end product.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Various embodiments are described below for examples.

Example 1 may be a method for estimating dimple etch recess depth in a gate-all-around transistor, the method comprising: receiving, by at least one processor of a device, first measurements of the gate-all-around transistor, the first measurements based on first optical data from a spacer etch stage of fabricating the gate-all-around transistor; inputting, by the at least one processor, using a feed forward network, the first measurements to a machine learning model trained to estimate dimple etch recesses in the gate-all-around transistor; inputting, by the at least one processor, to the machine learning model, second optical data from a dimple etch stage of fabricating the gate-all-around transistor; and generating, by the at least one processor, using the machine learning model, based on the second optical data and the first measurements, second measurements comprising the first measurements and dimple etch recess estimates for the gate-all-around transistor.

Example 2 may include the method of claim 1 and/or some other example herein, further comprising refraining from identifying, using the machine learning model, a correlation between the second optical data and the first measurements.

Example 3 may include the method of claim 1 and/or some other example herein, wherein the dimple etch recess estimates comprise a first estimate of a first dimple recess depth, a second estimate of a second dimple recess depth, and an average of the first estimate and the second estimate.

Example 4 may include the method of claim 1 and/or some other example herein, wherein the machine learning model is trained using training data indicative of transmission electron microscope data associated with dimple etch recesses of the gate-all-around transistor.

Example 5 may include the method of claim 1 and/or some other example herein, wherein the machine learning model is trained using training data indicative of a single set of process skews comprising percentages of Silicon Germanium associated with atomic layer depositions of the gate-all-around transistor.

Example 6 may include the method of claim 1 and/or some other example herein, wherein the first measurements comprise a polysilicon measurement, and wherein the dimple etch recess estimates are associated with Silicon Germanium.

Example 7 may include the method of claim 1 and/or some other example herein, wherein generating the second measurements comprises estimating the dimple etch recess estimates based on atomic layer deposition measurements of the first measurements.

Example 8 may include the method of claim 1 and/or some other example herein, wherein generating the second measurements comprises including the first measurements in the second measurements without modifying or re-measuring the first measurements.

Example 9 may include a non-transitory computer-readable medium comprising instructions to cause processing circuitry of a device for estimating dimple etch recess depth in a gate-all-around transistor, upon execution of the instructions by the processing circuitry, to: receive first measurements of the gate-all-around transistor, the first measurements based on first optical data from a spacer etch stage of fabricating the gate-all-around transistor; input, using a feed forward network, the first measurements to a machine learning model trained to estimate dimple etch recesses in the gate-all-around transistor; input, to the machine learning model, second optical data from a dimple etch stage of fabricating the gate-all-around transistor; and generate, using the machine learning model, based on the second optical data and the first measurements, second measurements comprising the first measurements and dimple etch recess estimates for the gate-all-around transistor.

Example 10 may include the non-transitory computer-readable medium of example 9 and/or some other example herein, wherein the instructions further cause the processing circuitry to: refrain from identifying, using the machine learning model, a correlation between the second optical data and the first measurements.

Example 11 may include the non-transitory computer-readable medium of example 9 and/or some other example herein, wherein the dimple etch recess estimates comprise a first estimate of a first dimple recess depth, a second estimate of a second dimple recess depth, and an average of the first estimate and the second estimate.

Example 12 may include the non-transitory computer-readable medium of example 9 and/or some other example herein, wherein the machine learning model is trained using training data indicative of transmission electron microscope data associated with dimple etch recesses of the gate-all-around transistor.

Example 13 may include the non-transitory computer-readable medium of example 9 and/or some other example herein, wherein the machine learning model is trained using training data indicative of a single set of process skews comprising percentages of Silicon Germanium associated with atomic layer depositions of the gate-all-around transistor.

Example 14 may include the non-transitory computer-readable medium of example 9 and/or some other example herein, wherein the first measurements comprise a polysilicon measurement, and wherein the dimple etch recess estimates are associated with Silicon Germanium.

Example 15 may include the non-transitory computer-readable medium of example 9 and/or some other example herein, wherein to generate the second measurements comprises to estimate the dimple etch recess estimates based on atomic layer deposition measurements of the first measurements.

Example 16 may include the non-transitory computer-readable medium of example 9 and/or some other example herein, wherein to generate the second measurements comprises to include the first measurements in the second measurements without modifying or re-measuring the first measurements.

Example 17 may include a device for estimating dimple etch recess depth in a gate-all-around transistor, the device comprising processing circuitry coupled to memory, the processing circuitry being configured to: receive first measurements of the gate-all-around transistor, the first measurements based on first optical data from a spacer etch stage of fabricating the gate-all-around transistor; input, using a feed forward network, the first measurements to a machine learning model trained to estimate dimple etch recesses in the gate-all-around transistor; input, to the machine learning model, second optical data from a dimple etch stage of fabricating the gate-all-around transistor; and generate, using the machine learning model, based on the second optical data and the first measurements, second measurements comprising the first measurements and dimple etch recess estimates for the gate-all-around transistor.

Example 18 may include the device of example 17 and/or any other example herein, wherein the processing circuitry is further configured to: refrain from identifying, using the machine learning model, a correlation between the second optical data and the first measurements.

Example 19 may include the device of example 17 and/or any other example herein, wherein the dimple etch recess estimates comprise a first estimate of a first dimple recess depth, a second estimate of a second dimple recess depth, and an average of the first estimate and the second estimate.

Example 20 may include the device of example 17 and/or any other example herein, wherein the machine learning model is trained using training data indicative of transmission electron microscope data associated with dimple etch recesses of the gate-all-around transistor.

Example 21 may be an apparatus including means for: receiving first measurements of a gate-all-around transistor, the first measurements based on first optical data from a spacer etch stage of fabricating the gate-all-around transistor; inputting, using a feed forward network, the first measurements to a machine learning model trained to estimate dimple etch recesses in the gate-all-around transistor; inputting, to the machine learning model, second optical data from a dimple etch stage of fabricating the gate-all-around transistor; and generating, using the machine learning model, based on the second optical data and the first measurements, second measurements comprising the first measurements and dimple etch recess estimates for the gate-all-around transistor.

Example 22 may include one or more non-transitory computer-readable media comprising instructions to cause an electronic device, upon execution of the instructions by one or more processors of the electronic device, to perform one or more elements of a method described in or related to any of examples 1-21, or any other method or process described herein Example 23 may include an apparatus comprising logic, modules, and/or circuitry to perform one or more elements of a method described in or related to any of examples 1-21, or any other method or process described herein.

Example 24 may include a method, technique, or process as described in or related to any of examples 1-21, or portions or parts thereof.

Example 25 may include an apparatus comprising: one or more processors and one or more computer readable media comprising instructions that, when executed by the one or more processors, cause the one or more processors to perform the method, techniques, or process as described in or related to any of examples 1-21, or portions thereof.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A method for estimating dimple etch recess depth in a gate-all-around transistor, the method comprising:
receiving, by at least one processor of a device, first measurements of the gate-all-around transistor, the first measurements based on first optical data from a spacer etch stage of fabricating the gate-all-around transistor;
inputting, by the at least one processor, using a feed forward network, the first measurements to a machine learning model trained to estimate dimple etch recesses in the gate-all-around transistor;
inputting, by the at least one processor, to the machine learning model, second optical data from a dimple etch stage of fabricating the gate-all-around transistor; and
generating, by the at least one processor, using the machine learning model, based on the second optical data and the first measurements, second measurements comprising the first measurements and individual dimple etch recess estimates for the gate-all-around transistor;

performing a dimple etch fabrication portion of a fabrication process using the individual dimple etch recess estimates.

2. The method of claim 1, further comprising:
refraining from identifying, using the machine learning model, a correlation between the second optical data and the first measurements.

3. The method of claim 1, wherein the dimple etch recess estimates comprise a first estimate of a first dimple recess depth, a second estimate of a second dimple recess depth, and an average of the first estimate and the second estimate.

4. The method of claim 1, wherein the machine learning model is trained using training data indicative of transmission electron microscope data associated with dimple etch recesses of the gate-all-around transistor.

5. The method of claim 1, wherein the machine learning model is trained using training data indicative of a single set of process skews comprising percentages of Silicon Germanium associated with atomic layer depositions of the gate-all-around transistor.

6. The method of claim 1, wherein the first measurements comprise a polysilicon measurement, and wherein the dimple etch recess estimates are associated with Silicon Germanium.

7. The method of claim 1, wherein generating the second measurements comprises estimating the dimple etch recess estimates based on atomic layer deposition measurements of the first measurements.

8. The method of claim 1, wherein generating the second measurements comprises including the first measurements in the second measurements without modifying or re-measuring the first measurements.

9. A non-transitory computer-readable storage medium comprising instructions to cause processing circuitry of a device for estimating dimple etch recess depth in a gate-all-around transistor, upon execution of the instructions by the processing circuitry, to:
receive first measurements of the gate-all-around transistor, the first measurements based on first optical data from a spacer etch stage of fabricating the gate-all-around transistor;
input, using a feed forward network, the first measurements to a machine learning model trained to estimate dimple etch recesses in the gate-all-around transistor;
input, to the machine learning model, second optical data from a dimple etch stage of fabricating the gate-all-around transistor; and
generate, using the machine learning model, based on the second optical data and the first measurements, second measurements comprising the first measurements and individual dimple etch recess estimates for the gate-all-around transistor;
perform a dimple etch fabrication portion of a fabrication process using the individual dimple etch recess estimates.

10. The non-transitory computer-readable storage medium of claim 9, wherein the instructions further cause the processing circuitry to:
refrain from identifying, using the machine learning model, a correlation between the second optical data and the first measurements.

11. The non-transitory computer-readable storage medium of claim 9, wherein the dimple etch recess estimates comprise a first estimate of a first dimple recess depth, a second estimate of a second dimple recess depth, and an average of the first estimate and the second estimate.

12. The non-transitory computer-readable storage medium of claim 9, wherein the machine learning model is trained using training data indicative of transmission electron microscope data associated with dimple etch recesses of the gate-all-around transistor.

13. The non-transitory computer-readable storage medium of claim 9, wherein the machine learning model is trained using training data indicative of a single set of process skews comprising percentages of Silicon Germanium associated with atomic layer depositions of the gate-all-around transistor.

14. The non-transitory computer-readable storage medium of claim 9, wherein the first measurements comprise a polysilicon measurement, and wherein the dimple etch recess estimates are associated with Silicon Germanium.

15. The non-transitory computer-readable storage medium of claim 9, wherein to generate the second measurements comprises to estimate the dimple etch recess estimates based on atomic layer deposition measurements of the first measurements.

16. The non-transitory computer-readable storage medium of claim 9, wherein to generate the second measurements comprises to include the first measurements in the second measurements without modifying or re-measuring the first measurements.

17. A device for estimating dimple etch recess depth in a gate-all-around transistor, the device comprising processing circuitry coupled to memory, the processing circuitry being configured to:
receive first measurements of the gate-all-around transistor, the first measurements based on first optical data from a spacer etch stage of fabricating the gate-all-around transistor;
input, using a feed forward network, the first measurements to a machine learning model trained to estimate dimple etch recesses in the gate-all-around transistor;
input, to the machine learning model, second optical data from a dimple etch stage of fabricating the gate-all-around transistor; and
generate, using the machine learning model, based on the second optical data and the first measurements, second measurements comprising the first measurements and individual dimple etch recess estimates for the gate-all-around transistor;
perform a dimple etch fabrication portion of a fabrication process using the individual dimple etch recess estimates.

18. The device of claim 17, wherein the processing circuitry is further configured to:
refrain from identifying, using the machine learning model, a correlation between the second optical data and the first measurements.

19. The device of claim 17, wherein the dimple etch recess estimates comprise a first estimate of a first dimple recess depth, a second estimate of a second dimple recess depth, and an average of the first estimate and the second estimate.

20. The device of claim 17, wherein the machine learning model is trained using training data indicative of transmission electron microscope data associated with dimple etch recesses of the gate-all-around transistor.

* * * * *